(12) United States Patent
Bao et al.

(10) Patent No.: US 8,937,384 B2
(45) Date of Patent: Jan. 20, 2015

(54) THERMAL MANAGEMENT OF INTEGRATED CIRCUITS USING PHASE CHANGE MATERIAL AND HEAT SPREADERS

(75) Inventors: Zhongping Bao, San Diego, CA (US); James D. Burrell, San Diego, CA (US); Liang Cheng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 99 days.

(21) Appl. No.: 13/455,536

(22) Filed: Apr. 25, 2012

(65) Prior Publication Data
US 2013/0285233 A1 Oct. 31, 2013

(51) Int. Cl.
*H01L 23/34* (2006.01)

(52) U.S. Cl.
USPC .......................................... 257/714; 257/707

(58) Field of Classification Search
USPC .......... 257/706, 707, 712, 713, 714, 722, 796
See application file for complete search history.

(56) References Cited

U.S. PATENT DOCUMENTS

| 5,315,154 | A | 5/1994 | Elwell | |
|---|---|---|---|---|
| 6,317,321 | B1 | 11/2001 | Fitch et al. | |
| 6,703,128 | B2* | 3/2004 | Myers et al. | 428/403 |
| 7,367,195 | B2 | 5/2008 | Sauciuc et al. | |
| 7,781,900 | B2* | 8/2010 | Carmona et al. | 257/789 |
| 7,906,857 | B1* | 3/2011 | Hoang et al. | 257/783 |
| 8,013,440 | B2* | 9/2011 | Warren | 257/713 |
| 8,014,150 | B2 | 9/2011 | Campbell et al. | |
| 8,018,720 | B2 | 9/2011 | Campbell et al. | |
| 2002/0033247 | A1 | 3/2002 | Neuschutz et al. | |
| 2004/0169272 | A1 | 9/2004 | Hembree | |
| 2005/0287766 | A1 | 12/2005 | Chrysler et al. | |
| 2006/0060952 | A1* | 3/2006 | Yuan et al. | 257/675 |
| 2008/0137300 | A1* | 6/2008 | Macris et al. | 361/699 |
| 2008/0170368 | A1* | 7/2008 | Chen et al. | 361/701 |
| 2008/0203571 | A1 | 8/2008 | Jungnickel et al. | |
| 2008/0242002 | A1* | 10/2008 | Colgan et al. | 438/118 |
| 2008/0296757 | A1* | 12/2008 | Hoffman et al. | 257/713 |

(Continued)

FOREIGN PATENT DOCUMENTS

| EP | 0461544 A1 | 12/1991 |
|---|---|---|
| EP | 1162659 A2 | 12/2001 |

(Continued)

OTHER PUBLICATIONS

Kandasamy, Ravi, et al.; Transient Cooling of Electronics Using Phase Change Material (PCM)-Based Heat Sinks; 2008 Applied Thermal Engineering 28; pp. 1047-1057.

(Continued)

*Primary Examiner* — S. V. Clark
(74) *Attorney, Agent, or Firm* — Michelle S. Gallardo

(57) ABSTRACT

At least one feature pertains to an apparatus having passive thermal management that includes an integrated circuit die, a heat spreader thermally coupled to the integrated circuit die, a phase change material (PCM) thermally coupled to the heat spreader, and a molding compound that encases the heat spreader and the PCM. In one example, the heat spreader may include a plurality of fins, and at least a portion of the PCM is interposed between the plurality of fins. Another feature pertains to an apparatus that includes an integrated circuit die, and a molding compound having a phase change material intermixed therein. The resulting molding compound completely encases the die.

31 Claims, 19 Drawing Sheets

(56) References Cited

U.S. PATENT DOCUMENTS

| | | | |
|---|---|---|---|
| 2009/0085228 A1 | 4/2009 | Sun et al. | |
| 2011/0248208 A1 | 10/2011 | Rolland et al. | |
| 2012/0049341 A1* | 3/2012 | Bezama et al. | 257/713 |
| 2012/0175766 A1* | 7/2012 | Casey et al. | 257/712 |
| 2013/0258599 A1* | 10/2013 | Danello et al. | 361/706 |

FOREIGN PATENT DOCUMENTS

| | | | |
|---|---|---|---|
| EP | 1336992 A2 | 8/2003 | |
| EP | 1703557 A2 | 9/2006 | |
| JP | 2004200428 A | 7/2004 | |
| WO | WO-0054332 A1 | 9/2000 | |
| WO | WO-03049152 A2 | 6/2003 | |
| WO | WO-2005036587 A2 | 4/2005 | |
| WO | 2011/058383 A2 | 5/2011 | |

OTHER PUBLICATIONS

International Search Report and Written Opinion—PCT/US2013/037775—ISA/EPO—Sep. 6, 2013.

\* cited by examiner

THERMAL MANAGEMENT OF INTEGRATED CIRCUITS USING PHASE CHANGE MATERIAL AND HEAT SPREADERS

BACKGROUND

1. Field

Various features pertain to passive thermal management systems, methods, and devices for heat dissipation of integrated circuits.

2. Background

Advances in the electrical performance of silicon integrated circuits (ICs) have resulted in ever shrinking integrated circuit dies. However, as the area of the IC dies grow smaller, the power consumption, and thus the power density across the die, increases. Increased power density across the die directly translates to an increase in the amount of heat produced by the die. As semiconductor junction temperatures go up, carrier mobility decreases, Which degrades the performance of CMOS transistors and other electrical components of the IC. For example, a sustained 10° C. to 15° C. increase in junction temperatures can result in a 50% reduction of the lifespan of the IC.

Moreover, increased die temperatures may be problematic from a consumer use standpoint for certain types of electronic devices. For example, handheld consumer devices, such as mobile phones, laptops, tablet computers, electronic readers, smartphones, etc., cannot exceed specific temperatures along surfaces that may be touched by a user in order to safeguard the user from burns. Cooling one or more ICs within the device helps reduce the surface touch temperature of the device and also increases the lifespan of the ICs. Generally, ICs may be cooled using either passive or active thermal management systems.

Active thermal management systems commonly utilize fans and/or pumps to perform cooling. However, such systems are not practical solutions for handheld consumer devices that feature small form factors for increased portability. For example, many of the aforementioned handheld consumer devices on the market have thin form factors that may be less than a centimeter thick. Accommodating a fan for an integrated circuit within such a device is not only undesirable, but may be impossible. As a result, small form factor devices currently use passive thermal management systems, as well as on-chip thermal sensors and control logic that control the IC's power using dynamic thermal management techniques. These dynamic thermal management techniques may purposely limit the operational frequency and performance of the integrated circuits in order to reduce radiant heat.

FIG. 1 illustrates a schematic view of a cross-section of a flip-chip IC package 100 coupled to a passive thermal management device, for example, a heat spreader 114 found in the prior art. The package 100 includes an integrated circuit die 102 having a front surface 104 (i.e., active surface) that is coupled to a package substrate 106 (e.g., laminate substrate, metal based substrate, such as copper based substrate, etc.) via a die attach and/or underfill adhesive 108. The hack surface 110 of the die 102 has a backside metallization layer 112 that couples to the heat spreader 114 with some thermal interface material (not shown) deposited there between. An epoxy and/or resin molding compound 118 may also be used to stabilize and protect the die 102. The combination package 100 and heat spreader 114 have a thickness $t_{P1}$ (i.e., height) defined by the distance between the peak surface 124 of the heat spreader 114 and the bottom surface 122 of the substrate 106.

The heat spreader 114 preferably has a high thermal conductivity coefficient and fins 116 to help dissipate heat generated by the die 102. The heat spreader 114 is left exposed to the cooler ambient air surrounding it to dissipate heat. During operation, the die 102 heats up and transfers its heat energy to the heat spreader 114 via the backside metallization layer 112. The heat spreader 114 effectively "spreads out" the heat via its fins 116 and in effect transfers the heat energy to the ambient air surrounding it. In this fashion, the heat spreader 114 dissipates heat and lowers the operating temperature of the die 102. Larger heat spreaders having a larger cross sectional area and/or taller fins may be used to increase the heat dissipation performance of the heat spreader.

However, in high performance, small form factor devices, implementing the traditional heat spreader 114 as shown in FIG. 1 may not be practical or possible due to size constraints. FIG. 2 illustrates a schematic view of a cross-section of a flip-chip IC package 200 found in the prior art that does not include a heat spreader, and thus, has a thickness $t_{P2}$ that is substantially less than the thickness $t_{P1}$ shown in FIG. 1. Referring to FIG. 2, the package 200 includes an integrated circuit die 202 having a front surface 204 (i.e., active surface) that is coupled to a package substrate 206 via a die attach and/or underfill adhesive 208. An epoxy and/or resin molding compound 210 may also be used to stabilize and protect the die 202. The thickness $t_{P2}$ is defined by the distance between the peak surface 212 (i.e., height) of the molding compound 210 and the bottom surface 214 of the substrate 206. The die 202 may have on-chip thermal sensors and control logic that help control the package's 200 power consumption by using dynamic thermal management techniques. However, these dynamic thermal management techniques may limit the operational frequency of the die 202 in order to keep the die 202 cool, thereby sacrificing performance of the package 200.

Thus, there is a need for improved passive thermal management systems, methods, and devices that adequately dissipate heat generated by an integrated circuit without negatively affecting the performance of the circuit.

SUMMARY

One feature provides for an apparatus, such as an integrated circuit package, having passive thermal management that comprises an integrated circuit die, a heat spreader thermally coupled to an integrated circuit die, a phase change material (PCM) thermally coupled to the heat spreader, and a molding compound that encases, at least partially, the heat spreader and completely encases the PCM. According to one aspect, the heat spreader comprises a plurality of fins, and at least a portion of the PCM is interposed between the plurality of fins. According to one example, the heat spreader comprises a plurality of fins that form at least one basin, and at least a portion of the PCM resides in the basin. According to another aspect, the molding compound encasing the PCM physically touches the PCM. In one example, the heat spreader comprises a plurality of fins that form a plurality of basins containing the PCM, where the plurality of basins are positioned side-by-side next to each other along a length of the heat spreader. In another example, the heat spreader comprises a plurality of chambers that contain the PCM, where the heat spreader encases the PCM. According to one aspect, the plurality of chambers are positioned side-by-side next to each other along a length of the heat spreader. According to another aspect, the plurality of chambers are positioned. side-by-side next to each other along a thickness of the heat spreader.

According to one aspect of the disclosure, the heat spreader comprises a first region positioned over a high heat region of the die and a second region positioned over a low heat region of the die, where the first region includes a plurality of fins having the PCM interposed therein, and the second region lacks the PCM. The high heat region of the die generates heat energy at a greater rate than the low heat region of the die when the apparatus is powered ON. According to another aspect, the PCM passively dissipates heat energy generated by the die by changing phase from a solid to a liquid at its melting point. In one example, the melting point of the PCM is less than a maximum allowed operational temperature $t_M$ of the die. In another example, a thickness of the heat spreader is between one (1) times and ten (10) times a thickness of the die. In yet another example, the heat spreader is adapted to reduce die warpage. According to one aspect, the apparatus further comprises a backside metallization layer having a first side that is thermally coupled to the die and a second side that is thermally coupled to the heat spreader. According to one aspect, the PCM is at least one of a solid-liquid PCM and/or a solid-solid PCM. According to another aspect, the PCM is one of a shape-stabilized composite paraffin having expanded graphite, a micro-encapsulated composite paraffin and high density polyethylene compound having expanded graphite, a nano-encapsulated composite paraffin and high density polyethylene compound having expanded graphite, a micro-encapsulated composite paraffin and high density polyethylene compound, or a nano-encapsulated composite paraffin and high density polyethylene compound. According to another aspect, the molding compound comprises a molding compound phase change material. In one example, the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

Another feature provides a method for fabricating an apparatus having passive thermal management that comprises thermally coupling a phase change material (PCM) to a heat spreader, thermally coupling the heat spreader to the integrated circuit die, encasing, at least partially, the heat spreader within a molding compound, and completely encasing the PCM within the molding compound. According to one aspect of the disclosure, the method further comprises interposing at least a portion of the PCM between a plurality of fins of the heat spreader. According to another aspect, the heat spreader comprises a plurality of fins that form at least one basin, and the method further comprises depositing at least a portion of the PCM in the basin. According to yet another aspect, the heat spreader comprises a plurality of fins that form a plurality of basins containing the PCM, and the method farther comprises positioning the plurality of basins side-by-side next to each other along a length of the heat spreader. In another aspect of the disclosure, the method further comprises storing the PCM within a plurality of chambers within the heat spreader, and encasing the PCM within the heat spreader. According to another aspect, the integrated circuit die, the PCM, the heat spreader, and the molding compound form an integrated circuit package, and the method further comprises incorporating the integrated circuit package into at least one of a music player, a video player, an entertainment unit, a navigation device, a communications device, a mobile phone, a smartphone, a personal digital assistant, a fixed location terminal, a tablet computer, and/or a laptop computer.

Another feature provides an apparatus comprising an integrated circuit die, a means for passively dissipating heat energy thermally coupled to the integrated circuit die, a means for storing latent heat thermally coupled to the means for passively dissipating heat energy, and a means for encasing, at least partially, the means for passively dissipating heat energy, wherein the means for encasing, at least partially, the means for passively dissipating heat energy completely encases the means for storing latent heat. According to one aspect of the disclosure, the apparatus further comprises a means for increasing a surface area of the means for passively dissipating heat energy, wherein at least a portion of the means for storing latent heat is interposed between the means for increasing the surface area of the means for passively dissipating heat energy. In one example, the means for passively dissipating heat energy comprises means for containing the means for storing latent heat, where the means for passively dissipating heat energy encases the means for storing latent heat. In another example, the means for containing the means for storing latent heat is positioned side-by-side next to a second means for containing the means for storing latent heat along a length of the means for passively dissipating heat energy. In yet another example, the means for containing the means for storing latent heat is positioned side-by-side next to a second means for containing the means for storing latent heat along a thickness of the means for passively dissipating heat energy.

According to one aspect, the means for storing latent heat dissipates heat energy generated by the die by changing phase from a solid to a liquid at its melting point, and the melting point of the means for storing latent heat is less than a maximum allowed operational temperature $t_M$ of the die. According to another aspect, a thickness of the means for passively dissipating heat enemy is between one (1) times and ten (10) times a thickness of the die. According to yet another aspect, the means for encasing, at least partially, the means for passively dissipating heat energy comprises a phase change material. According to one aspect, the means for storing latent heat is a phase change material. In one example, the means for passively dissipating heat energy is a heat spreader. According to another example, the means for encasing is a molding compound.

Another feature provides a method for passively cooling a heat source that comprises thermally coupling the heat source to a thermal management apparatus, the thermal management apparatus including a heat spreader, a phase change material (PCM), and a molding compound, wherein the molding compound encases the PCM, and the molding compound encases, at least partially, the heat spreader, generating heat energy at the heat source, and passively dissipating the heat energy generated at the heat source by storing the heat energy generated as latent heat in the PCM. According to one aspect, the heat source is an integrated circuit die, and the molding compound encases the integrated circuit die. According to another aspect, the heat spreader is adapted to reduce integrated circuit die warpage. According to yet another aspect, the heat spreader comprises a first region positioned over a high heat region of the heat source and a second region positioned over a low heat region of the heat source, the first region including a plurality of fins having the PCM interposed therein, the second region lacking the PCM, wherein the high heat region of the heat source generates heat energy at a greater rate than the low heat region of the heat source. According to another aspect, the PCM passively dissipates heat energy generated by the heat source by changing phase from a solid to a liquid at its melting point. According to yet another aspect, the melting point of the PCM is less than a maximum allowed operational temperature $t_M$ of the heat source.

Another feature provides an apparatus, such as an integrated circuit package. that comprises an integrated circuit die, and a molding compound having a molding compound phase change material intermixed therein, where the molding compound encases the die. According to one aspect, the apparatus further comprises a heat spreader thermally coupled to the integrated circuit die, a phase change material thermally coupled to the heat spreader, wherein the molding compound encases, at least partially, the heat spreader, and completely encases the phase change material.

Another feature provides a method for fabricating an apparatus having passive thermal management that comprises intermixing a molding compound with a molding compound phase change material to produce an enhanced molding compound, and encasing the die with the enhanced molding compound. According to one aspect of the disclosure, the method further comprises thermally coupling a heat spreader to the integrated circuit die, thermally coupling a phase change material to the heat spreader, encasing, at least partially, the heat spreader within the enhanced molding compound, and completely encasing the phase change material within the enhanced molding compound.

Another feature provides an apparatus, such as an integrated circuit package, that comprises an integrated circuit die, and a means for encasing the die, wherein the means for encasing the die comprises a phase change material intermixed therein. According to one aspect, the apparatus further comprises a means for passively dissipating heat energy thermally coupled to the integrated circuit die, a means for storing latent heat thermally coupled to the means for passively dissipating heat energy, wherein the means for encasing encases, at least partially, the means for passively dissipating heat energy, and completely encases the means for storing latent heat.

Another feature provides a method for cooling an integrated, circuit die that comprises thermally coupling the integrated circuit die to a thermal management apparatus, the thermal management apparatus including an enhanced molding compound, the enhanced molding compound comprising a molding compound intermixed with a molding compound phase change material, generating heat energy at the integrated circuit die, and passively dissipating the heat energy generated at the integrated circuit die by absorbing the heat energy within the enhanced molding compound. According to one aspect, the thermal management apparatus further includes a heat spreader and a phase change material (PCM), wherein the enhanced molding compound encases the PCM, and the enhanced molding compound encases, at least partially, the heat spreader.

DETAILED DESCRIPTION

In the following description, specific details are given to provide a thorough understanding of the aspects of the disclosure. However, it will be understood by one of ordinary skill in the art that these aspects may be practiced without these specific details. Moreover, integrated circuits and integrated, circuit components may be shown in block diagrams in order to avoid obscuring the aspects in unnecessary detail. In other instances, well-known structures and techniques may also not be shown in detail in order not to obscure the various aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "heat spreader" is used herein to refer to a passive heat exchanger. The term "thermally coupled" is used herein to refer to the direct or indirect physical coupling between two objects that allows for the transfer of heat energy to take place between the two objects. For example, if object A physically touches object B, and object B touches object C, then objects A and C may still be considered thermally coupled—even if they do not touch each other—if object B in between allows for the transfer of heat energy from object A to object C and/or from object C to object A.

Overview

According to one aspect of the disclosure, a method and apparatus is provided that pertains to passive thermal management for integrated circuit packages. For example, an integrated circuit package may include an integrated circuit die, a heat spreader thermally coupled to the integrated circuit die, a phase change material (PCM) thermally coupled to the heat spreader, and a molding compound that encases the heat spreader and the PCM. In one example, the heat spreader may includes a plurality of fins, and at least a portion of the PCM is interposed between the plurality of fins. As the die heats up, heat energy is absorbed by the PCM as latent heat when the PCM transitions from a solid state to a liquid state. The heat energy absorbed by this process dissipates heat away from the die, and thus cools the die.

According to another aspect of the disclosure, an integrated circuit package may include an integrated circuit die and a molding compound having a phase change material intermixed therein. The resulting molding compound exhibits a higher thermal conductivity with latent heat storing features, and provides structural support to the die by completely encasing the die.

Figure 3:
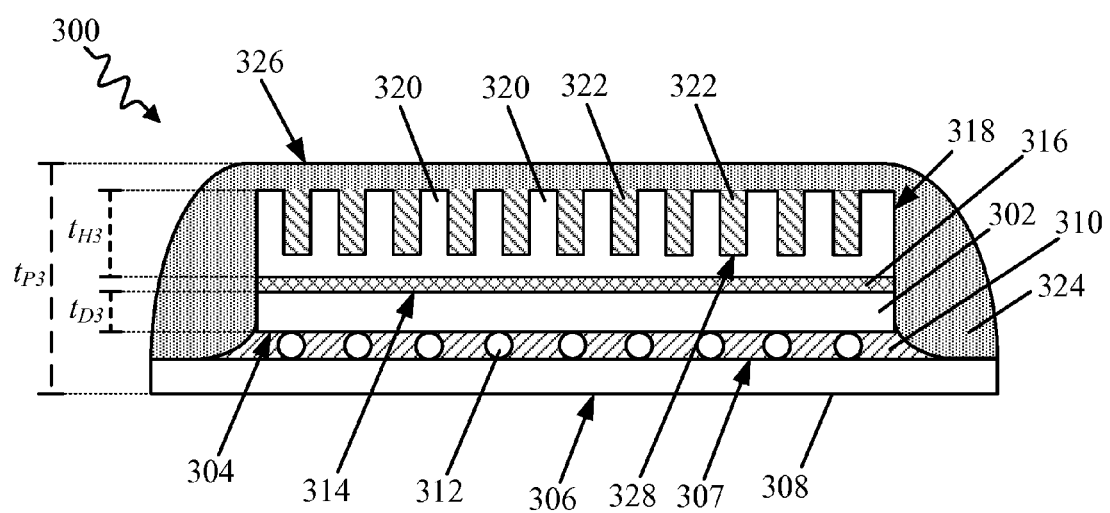
FIG. 3 illustrates a schematic view of a cross-section of a flip-chip IC package featuring passive thermal management.
Figure 4:
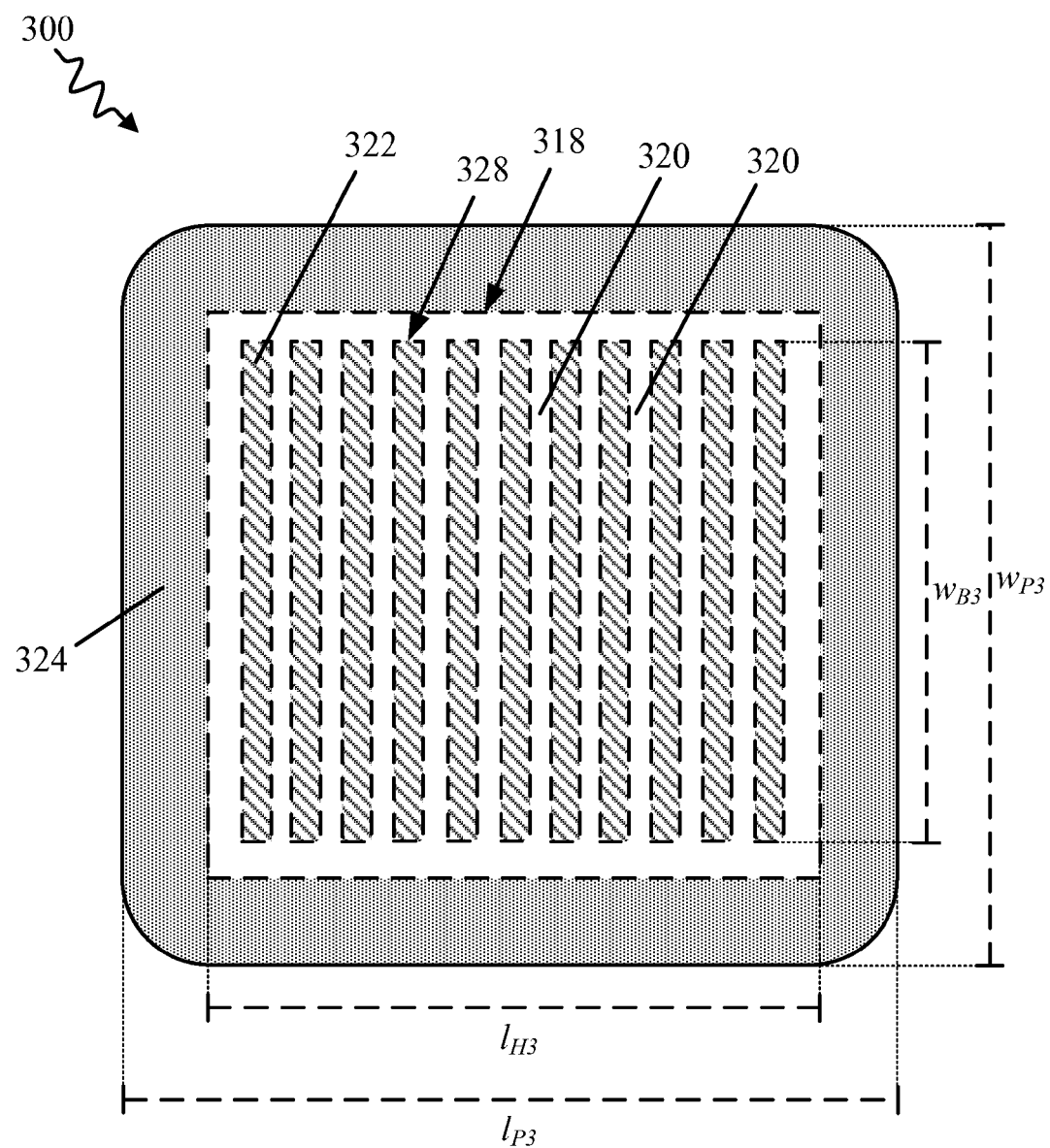
FIG. 4 illustrates a cutaway, top view of the package depicted in FIG. 3.

Exemplary Implementations of an Integrated Circuit Package Featuring a Heat Spreader and Phase Change Material FIGS. 3 and 4 illustrate schematic views of an integrated circuit (IC) package 300 featuring passive thermal management according to one aspect of the disclosure. Specifically, FIG. 3 illustrates a schematic view of a cross-section of the flip-chip IC package 300, and FIG. 4 illustrates a cutaway, top view of the package 300.

Referring to FIG. 3, the package 300 may comprise an IC die 302, a package substrate 308, die attach and/or underfill adhesive 310, a ball grid array 312, a backside metallization layer 316, a heat spreader 318 having fins 320, phase change material 322, and/or molding compound 324. The IC die 302 has undergone a series of etching and deposition steps to fabricate circuitry upon the semiconductor substrate of the die 302. The die 302 includes a front surface 304 (i.e., active surface) that may be bonded flip-chip fashion to electrical traces not shown) on a top surface 307 of the package substrate 308 (e.g., laminate substrate, metal based substrate, such as copper based substrate, etc.). The die attach and/or underfill adhesive 310 may help secure the die 302 to the substrate 308. The front surface 304 of the die 302 includes a grid of electrical connections that electrically couple to the electrical traces on the substrate's top surface 307. The electrical connections may comprise the ball grid array (BGA) 312 of solder balls, as illustrated, or another type of array, The back surface 314 of the die 30 faces the opposite direction of the front surface 304 and away from the top surface 307 of the substrate 308. The back surface 314 includes the backside metallization layer 316 that couples to the heat spreader 318. That is, the backside metallization layer 316 has a first side that is thermally coupled to the die 302 and a second side that is thermally coupled. to the heat spreader 318.

According to one aspect of the disclosure, a thermal interface material (not shown) may be deposited between the heat spreader 318 and the backside metallization layer 316 to aid with thermal conductivity between the heat spreader 318 and the backside metallization layer 316. As an example, the thermal interface material may be thermal grease or silicone oil filled with aluminum oxide, zinc oxide, and/or boron nitride. According to another aspect of the disclosure, the heat spreader 318 may be coupled directly to the backside metallization layer 316 without a thermal interface layer in between, According to yet another aspect of the disclosure, the backside metallization layer 316 may be absent and the heat spreader 318 may be directly coupled to the back surface 314 of the die 302.

The heat spreader 318 may be composed of any material that has relatively high thermal conductivity. For example, the heat spreader 318 may be composed of a metal, such as but not limited to, copper, aluminum, gold, silver, and platinum, or a metal alloy. The heat spreader 318 may also be composed of other materials, such as diamond, graphite, and/or graphene. One or more fins 320 may serve to increase the surface area of the heat spreader 318, thereby increasing its ability to dissipate heat away from the die 302. The fins 320 may extend in a direction orthogonal to the back surface 314 of the die 302.

The phase change material (PCM) 322 is interposed between the fins 30 of the heat spreader 318. The PCM 322 may be a solid-liquid PCM having a high heat of fusion that stores and releases large amounts of energy as it melts and solidifies, respectively, at a certain temperature(s). For example, heat is absorbed when the material changes from solid to liquid, and heat is released when the material changes from liquid to solid. According to one aspect, the PCM 322 makes direct physical contact with the heat spreader 318 and the fins 320 to maximize thermal conductivity between the heat spreader 318, the fins 320, and the PCM 322.

Figure 1:
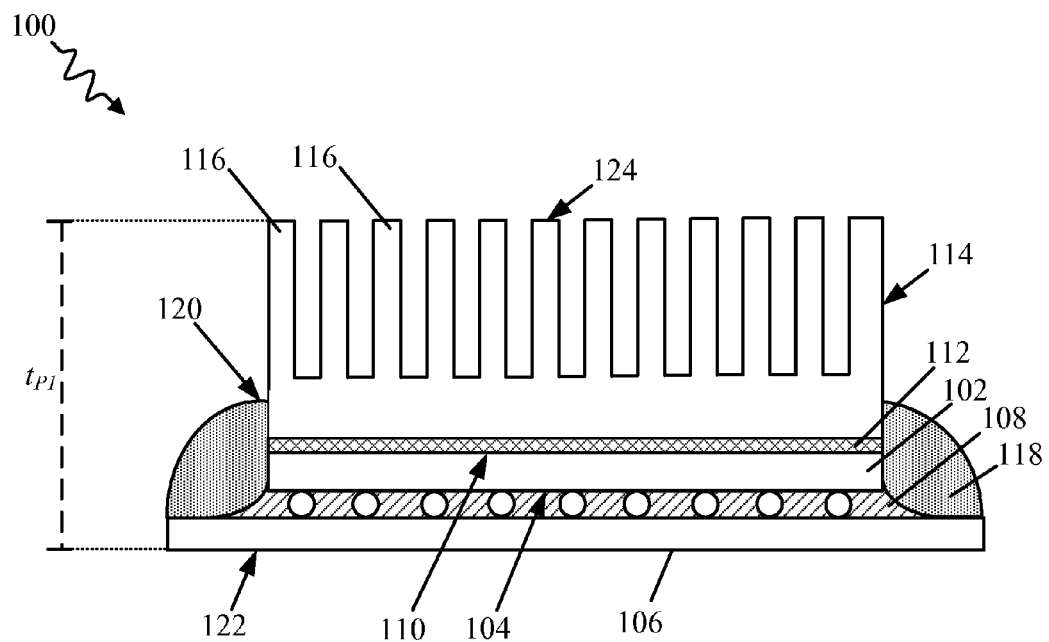
FIG. 1 illustrates a schematic view of a cross-section of a flip-chip IC package coupled to a heat spreader found in the prior art.

Furthermore, the package 300 includes an epoxy and/or resin molding compound 324 that encases the heat spreader 318 (including the fins 320 of the heat spreader 318), the PCM 322, the backside metallization layer 316, the die 302, the underfill material 310, and/or the electrical connections 312. Thus, unlike prior art designs where a heat spreader coupled to an IC is largely exposed to air (e.g., see FIG. 1), the heat spreader 318 and the PCM 322 of the IC package 300 illustrated in FIG. 3 are both encapsulated by the molding compound 324. Thus, the molding compound 324 keeps the PCM 322 completely contained so that it does not leak out of the package 300 when the PCM 322 is in, for example, a liquid state. The package 300 has a thickness $t_{P3}$ (i.e., height) bounded by the peak surface 326 of the molding compound 324 and the bottom surface 306 of the substrate 308. The heat spreader 318 has a thickness $t_{H3}$, and the die 302 has a thickness $t_{D3}$.

The heat spreader 318 and the PCM 322 serve to passively cool the die 302 during operation. For example, when the IC package 300 is powered up (e.g., the IC package 300 is turned ON and is operational) the die 302 generates heat and the temperature of the die 302 rises. The backside metallization layer 316 conducts the heat generated by the die 302 to the heat spreader 318 and the PCM 322, The temperature of the heat spreader 318 and the PCM 322 also rise as they absorb the heat energy generated by the die 302. By absorbing the heat energy, the heat spreader 318 and the PCM 322 cool the die 302 as they dissipate the heat energy away from the die 302.

As the temperature of the PCM 322 rises, the PCM 322 may at some instance reach its melting point causing the PCM 322 to transition from solid to liquid. During the transition from solid to liquid, the PCM 322 absorbs additional heat energy away from the die 302 (thereby further cooling the die 302) as it stores the heat energy as latent heat. When the IC package 300 turns off or enters a low power state, the temperature of the die 302, the heat spreader 318, and the PCM 322 begin to fall. If the temperature of the PCM 322 decreases down to its freezing point, the PCM 322 begins to transition from liquid to solid, and in the process the PCM 322 releases its latent heat energy. The heat energy released during this process may not negatively impact the performance of the die 302 because the die 302 may be undergoing a low power or power OFF state during this time. Thus, any heat released by the PCM 322 and absorbed by the die 302 during this time may be inconsequential, and may not increase the peak temperature achieved by the die 302 (since the die 302 may already be cool).

In this fashion, the PCM 322 dissipates heat energy away from the die 302 by transitioning from a solid to a liquid during times when the die 302 is operating at a high power and/or high temperature state, and releases heat energy by transitioning from a liquid to a solid during times when the die 302 is operating at a low power and/or low temperature state. For example, the die 302 may operate at a high power and/or high temperature state when the die 302 is performing intensive and/or extensive operations (e.g., computations). Similarly, the die 302 may operate at a low power and/or low temperature state when the die 302 is not performing intensive and extensive operations. By alternating between high power/temperature states and low power/temperature states, the dynamic operating temperature of the die 302 causes the PCM 322 to transition back and forth between liquid and solid states. The die 302 may alternate between high power/temperature states and low power/temperature states many times during a period of time (e.g., a second, a minute, an hour, etc.). Each time the PCM 322 transitions from a solid into a liquid during the period of time, the PCM 322 cools the die 302 by absorbing heat energy away from it and stores the energy as latent heat. If the duty cycle of the IC package 300 is such that the die 302 transitions back and forth between a high power/temperature state and a lower power/temperature state frequently, the benefit of having the PCM 322 in the package 300 is enhanced since the PCM 322 may transition from a solid, to a liquid many times during a period of time. Such frequent transitions equate to a greater amount of heat energy dissipated per period of time.

FIG. 4 illustrates a cutaway, top view of the IC package 300. Specifically, a portion of the molding compound 324 has been removed to illustrate the heat spreader 318, the fins 320, and the PCM 322 underneath. The package 300 has a width $w_{P3}$ and a length $l_{P3}$. Referring to FIGS. 3 and 4, the PCM 322 is deposited within a plurality of basins 328 formed between the fins 320 of the heat spreader. In the illustrated example, a plurality of basins 328 are shown, however, in other aspects of the disclosure there may be as few as one basin formed between two fins of a heat spreader. Referring to FIG. 4, the PCM 322 filled basins 328 are positioned side-by-side next to each other along the length $l_{H3}$ of the heat spreader 318 such that the widths $w_{B3}$ of the basins 328 are parallel to each other and the width $W_{P3}$ of the package 300.

According to one aspect of the disclosure, the package 300 may be manufactured by first heating the PCM 322 beyond its melting point until the PCM 322 is liquid. Then, the liquid PCM 322 may be deposited into the basins 328 between the fins 320 of the heat spreader 318. Next, the heat spreader 318 may be thermally coupled. directly or indirectly (e.g., via backside metallization 316 and/or thermal interface material) to the die 302. Last, the die 302, the heat spreader 318, and the PCM 322 may be encapsulated/encased by the molding compound 324. According to one aspect of the disclosure, the backside metallization layer 316 and the heat spreader 318 may be one piece, such that the separate backside metallization layer 316 may be absent and the heat spreader 318 serves as a form of backside metallization.

Figure 5:
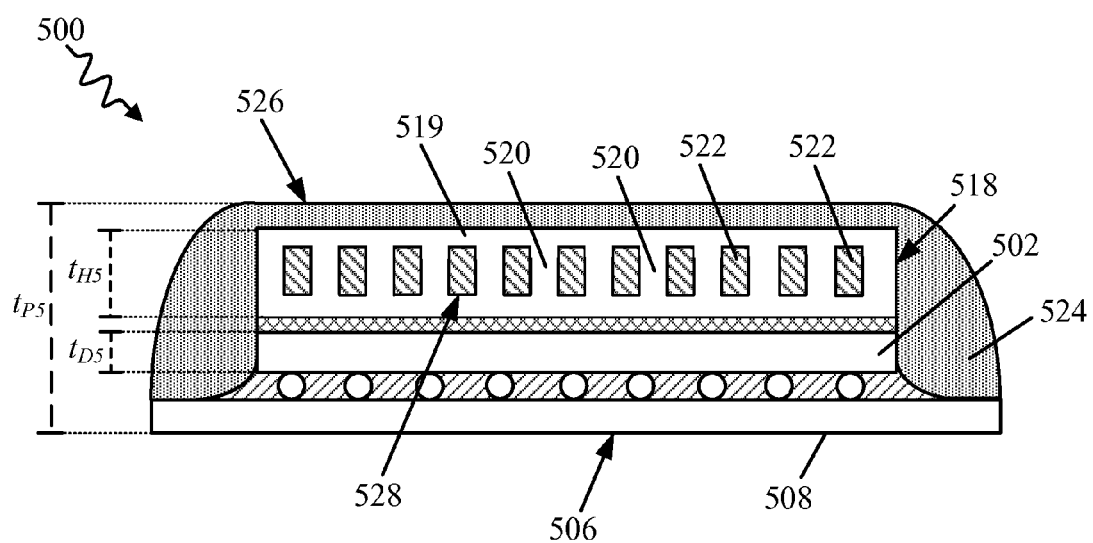
FIG. 5 illustrates a schematic view of a cross-section of a flip-chip IC package featuring passive thermal management.
Figure 6:
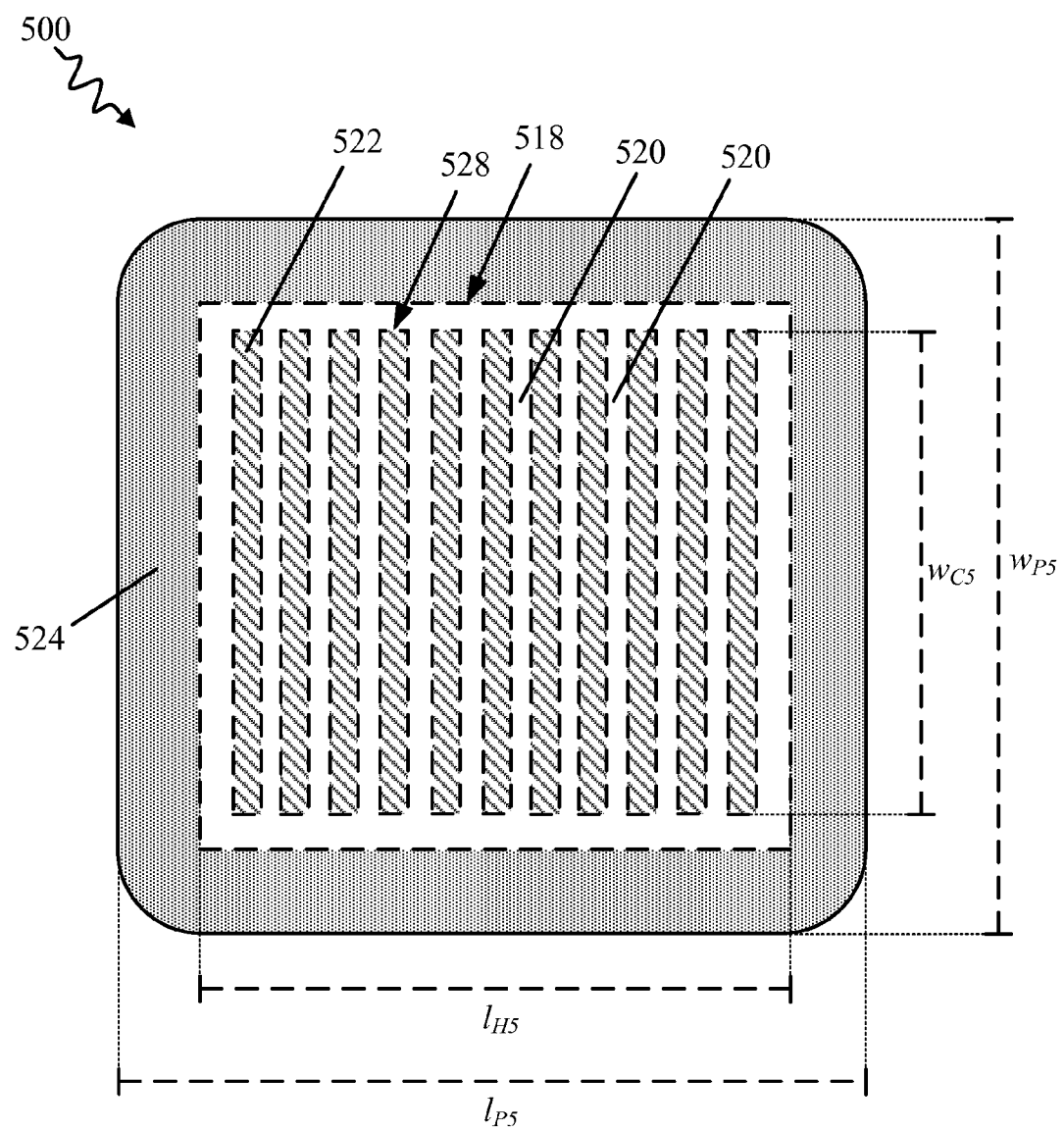
FIG. 6 illustrates a cutaway, top view of the package depicted in FIG. 5.

FIGS. 5 and 6 illustrate schematic views of an IC package 500 featuring passive thermal management according to another aspect of the disclosure. Specifically, FIG. 5 illustrates a schematic view of a cross-section of the flip-chip IC package 500, and FIG. 6 illustrates a cutaway, top view of the package 500. The package 500 is structurally and functionally identical to the package 300 shown in FIGS. 3 and 4, except for some differences discussed below regarding the structure of the heat spreader 518 and the manner in which the PCM 522 is positioned therein.

Referring to FIG. 5, the heat spreader 518 of the package 500 includes a top portion 519 that seals the PCM 522 within the heat spreader 518. Thus, unlike the package 300, the PCM 522 does not directly contact the molding compound 524. Therefore, the PCM 522 is encased by the heat spreader 518, which is in turn encased by the molding compound 524. Moreover, the heat spreader 518 includes chamber barriers 520 that—like the fins 320 of the package 300—increase the surface area of the heat spreader 518. The chamber barriers 520 also form chambers 528 within which the PCM 522 resides. In the illustrated example, a plurality of chambers 528 are shown, however, in other aspects of the disclosure there may be as few as one chamber formed between two chamber barriers of a heat spreader. The package 500 has a thickness $t_{P5}$ (i.e., height) bounded by the peak surface 526 of the molding compound 524 and the bottom surface 506 of the substrate 508. The heat spreader 518 has a thickness $t_{H5}$, and the die 502 has a thickness $t_{D5}$.

Referring to FIG. 6, a portion of the molding compound 524 and the top portion 519 of the heat spreader 518 have been removed to illustrate the heat spreader 518, the chamber barriers 520, and the chambers 528 filled with PCM 522. The package 500 has a width $w_{P5}$ and a length $l_{P5}$. The PCM 522 filled chambers 528 are positioned side-by-side next to each other along the length $l_{H5}$ of the heat spreader 518 such that the widths $w_{C5}$ of the chambers 528 are parallel to each other and the width $w_{P5}$ of the package 500. According to one aspect of the disclosure, the molding compound 524 may only partially encase the heat spreader 518 such that a portion of the heat spreader 518 is exposed to ambient air outside of the package 500. For example, referring to FIG. 5, the top portion 519 of the heat spreader 518 may be exposed to air.

Figure 7:
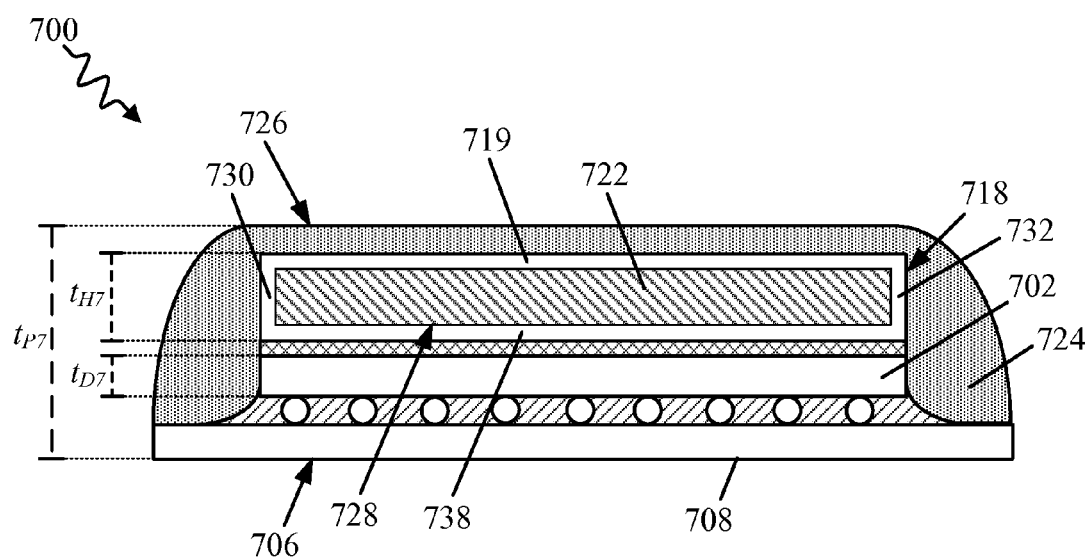
FIG. 7 illustrates a schematic view of a cross-section of a flip-chip IC package featuring passive thermal management.
Figure 8:
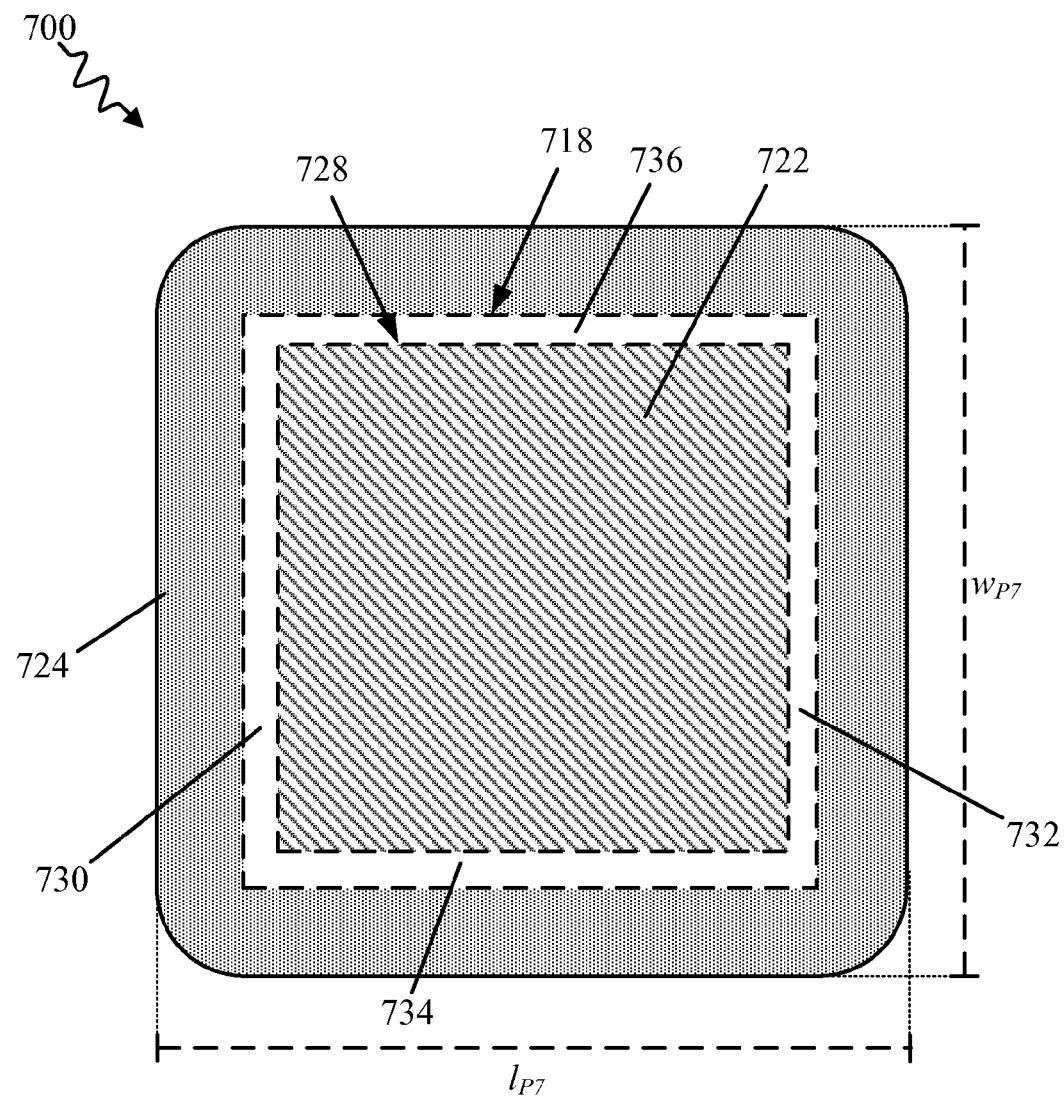
FIG. 8 illustrates a cutaway, top view of the package depicted in FIG. 7.

FIGS. 7 and 8 illustrate schematic views of an IC package 700 featuring passive thermal management according to another aspect of the disclosure. Specifically, FIG. 7 illustrates a schematic view of a cross-section of the flip-chip IC package 700, and FIG. 8 illustrates a cutaway, top view of the package 700. The package 700 is structurally and functionally similar to the package 300 shown in FIGS. 3 and 4, except for a some differences discussed below regarding the structure of the heat spreader 718 and the manner in which the PCM 722 is positioned therein.

Referring to FIG. 7, the heat spreader 718 of the package 700 includes a top portion 719 and may not include fins. As such, the heat spreader 718 includes a single, main chamber 728 within which the PCM 722 resides. The main chamber 728 is the region bounded by a first side wall 730, a second side wall 732, a front wall 734 (See FIG. 8), a back wall 736 (See FIG. 8), a bottom portion 738, and the top portion 719 of the heat spreader 718. The top portion 719 of the heat spreader 718 seals the PCM 722 within the heat spreader 718, and thus unlike the package 300, the PCM 722 does not directly contact the molding compound 724. Therefore, the PCM 722 is encased by the heat spreader 718, which is in turn encased by the molding compound. 724. The package 700 has a thickness $t_{P7}$ (i.e., height) bounded by the peak surface 726 of the molding compound 724 and the bottom surface 706 of the substrate 708. The heat spreader 718 has a thickness $t_{H7}$, and the die 702 has a thickness $t_{D7}$.

Referring to FIG. 8, a portion of the molding compound 724 and the top portion 719 of the heat spreader 718 have been removed to illustrate the heat spreader 718 and the main chamber 728 filled with PCM 722, The package 700 has a width $w_{P7}$ and a length $l_{P7}$. According to one aspect of the disclosure, the molding compound 724 may only partially encase the heat spreader 718 such that a portion of the heat spreader 718 is exposed to ambient air outside of the package 700. For example, referring to FIG. 7, the top portion 719 of the heat spreader 718 may be exposed to air.

Figure 9:
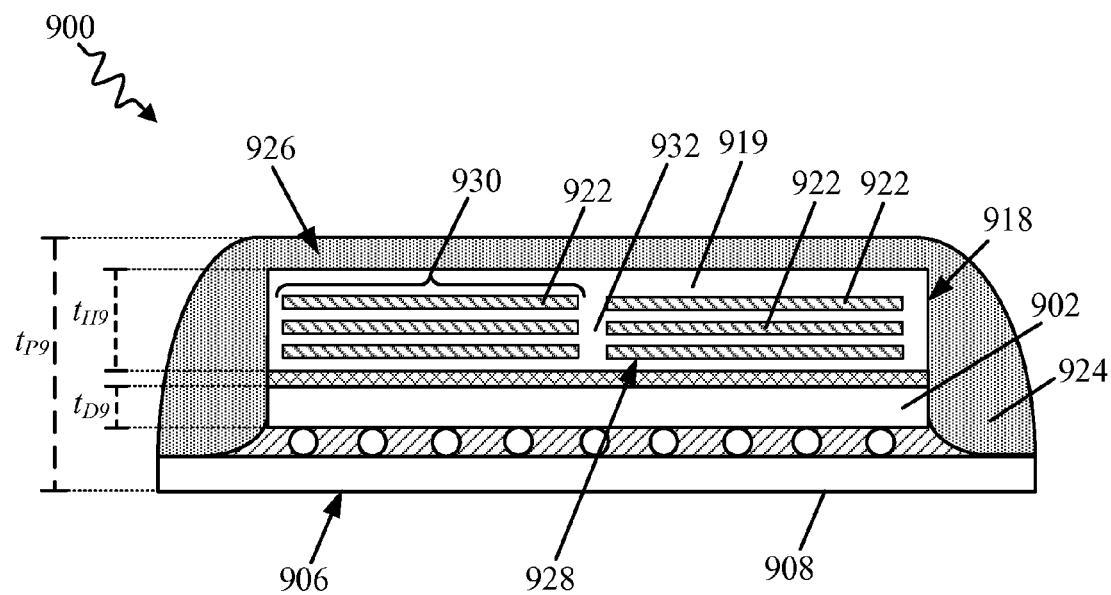
FIG. 9 illustrates a schematic view of a cross-section of a flip-chip IC package featuring passive thermal management.
Figure 10:
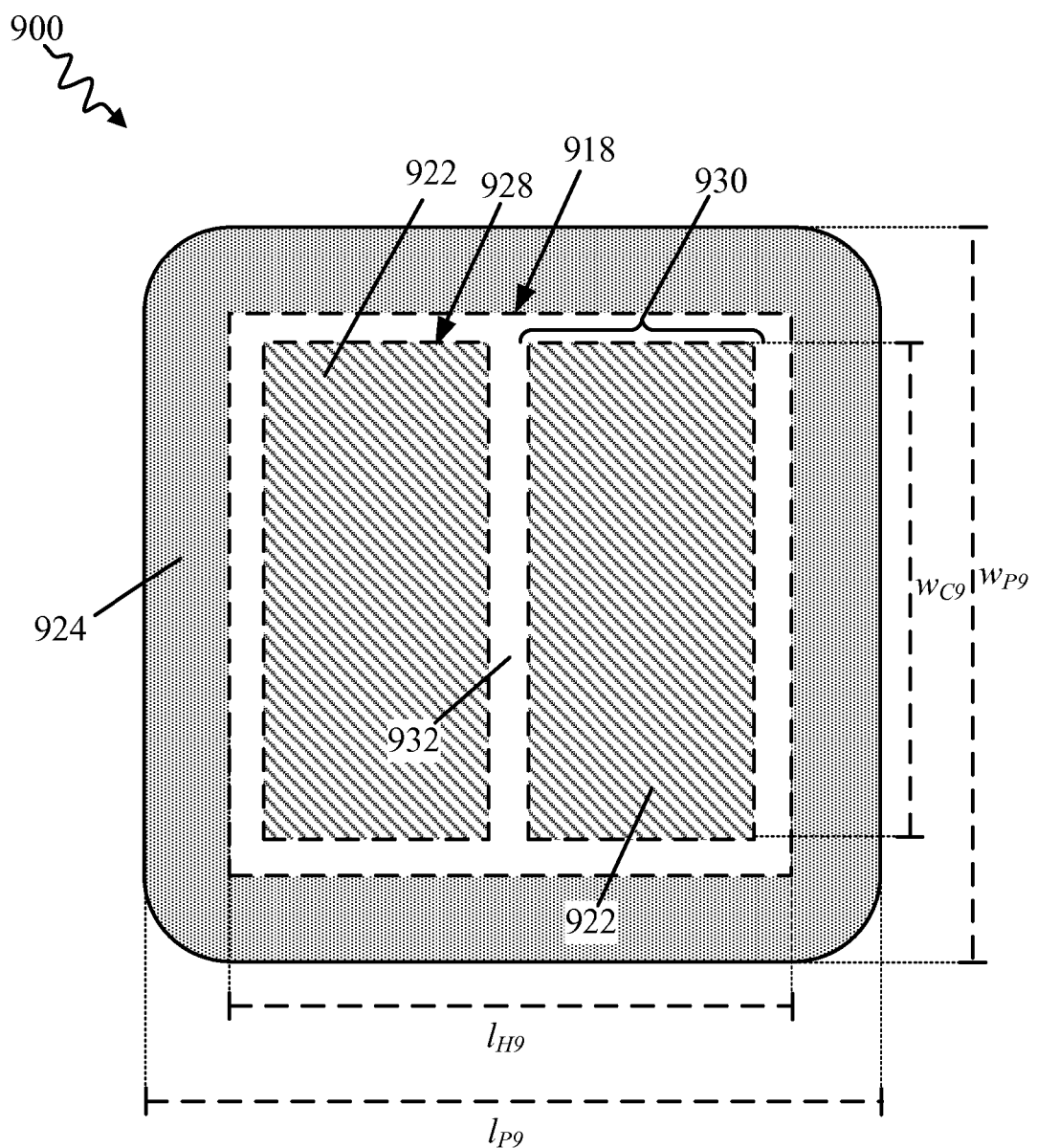
FIG. 10 illustrates a cutaway, top view of the package depicted in FIG. 9.

FIGS. 9 and 10 illustrate schematic views of an IC package 900 featuring passive thermal management according to another aspect of the disclosure. Specifically, FIG. 9 illustrates a schematic view of a cross-section of the flip-chip IC package 900, and FIG. 10 illustrates a cutaway, top view of the package 900. The package 900 is structurally and functionally similar to the package 300 shown in FIGS. 3 and 4, except for a some differences in the structure of the heat spreader 918 and the manner in which the PCM 922 is positioned therein.

Referring to FIG. 9, the heat spreader 918 includes a plurality of chambers 928 that are fully enclosed by the heat spreader 918, Each of the plurality of chambers 928 includes PCM 922 to help dissipate heat generated by the die 902 in the manner described above with reference to the package 300. As illustrated, the chambers 928 may be oriented such that there is one or more chamber stacks 930. Each chamber stack 930 may have one or more chambers 928 that are stacked on top of each other along the thickness $t_{H9}$ (i.e., height) of the heat spreader 918. The package 900 has a thickness $t_{P9}$ (i.e., height) bounded by the peak surface 926 of the molding compound 924 and the bottom surface 906 of the substrate 908. The die 902 has a thickness $t_{D9}$.

In FIG. 10 a portion of the molding compound 924 and a top portion 919 of the heat spreader 918 have been removed to illustrate the heat spreader 918, the chamber stacks 930 and the PCM 922 of the package 900. Referring to FIGS. 9 and 10, the PCM 922 filled chambers 928 are positioned side-by-side next to each other along the thickness $t_{H9}$ of the heat spreader 918 such that the widths $w_{C9}$ of the chambers 928 are parallel to each other and the width $w_{P9}$ of the package 900. Each chamber stack 930 is positioned side-by-side next to each other along the length $l_{H9}$ of the heat spreader 918 such that the widths $w_{C9}$ of the chambers 928 are parallel to each other and the width $w_{P9}$ of the package 900. In the example shown in FIG. 9, the heat spreader 918 includes two (2) chamber stacks 930 each having three (3) chambers 928. However, in other aspects of the disclosure, the heat spreader 918 may include one or more stacks 930 each having one or more chambers 928. The chamber stacks 930 may be separated from one another by a chamber wall 932. According to one aspect of the disclosure, the molding compound 924 may only partially encase the heat spreader 918 such that a portion of the heat spreader 918 is exposed to ambient air outside of the package 900. For example, referring to FIG. 9, the top portion 919 of the heat spreader 918 may be exposed to air.

Figure 11:
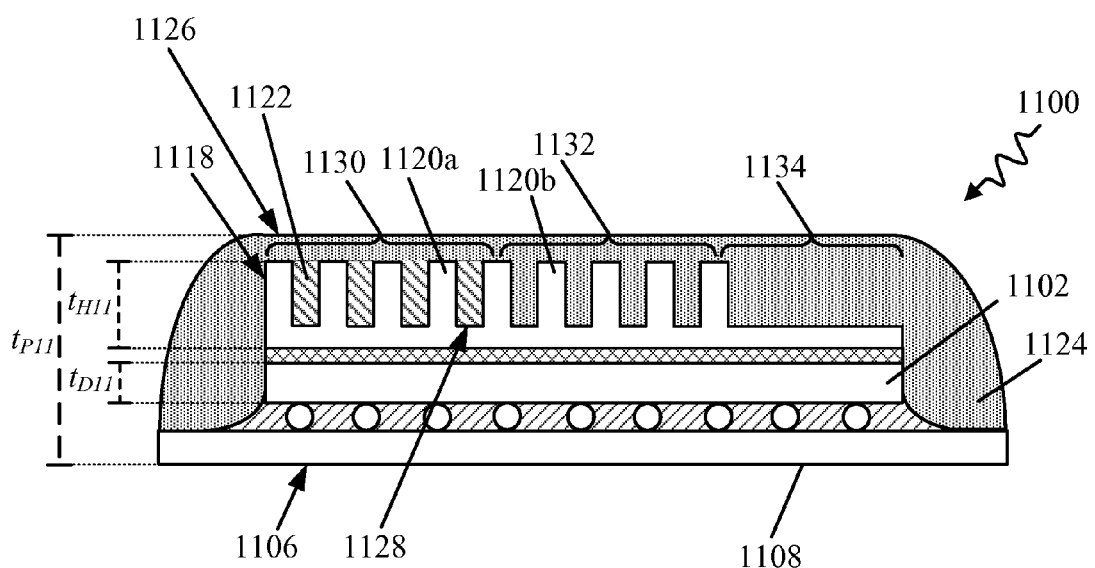
FIG. 11 illustrates a schematic view of a cross-section of a flip-chip IC package featuring passive thermal management.
Figure 12:
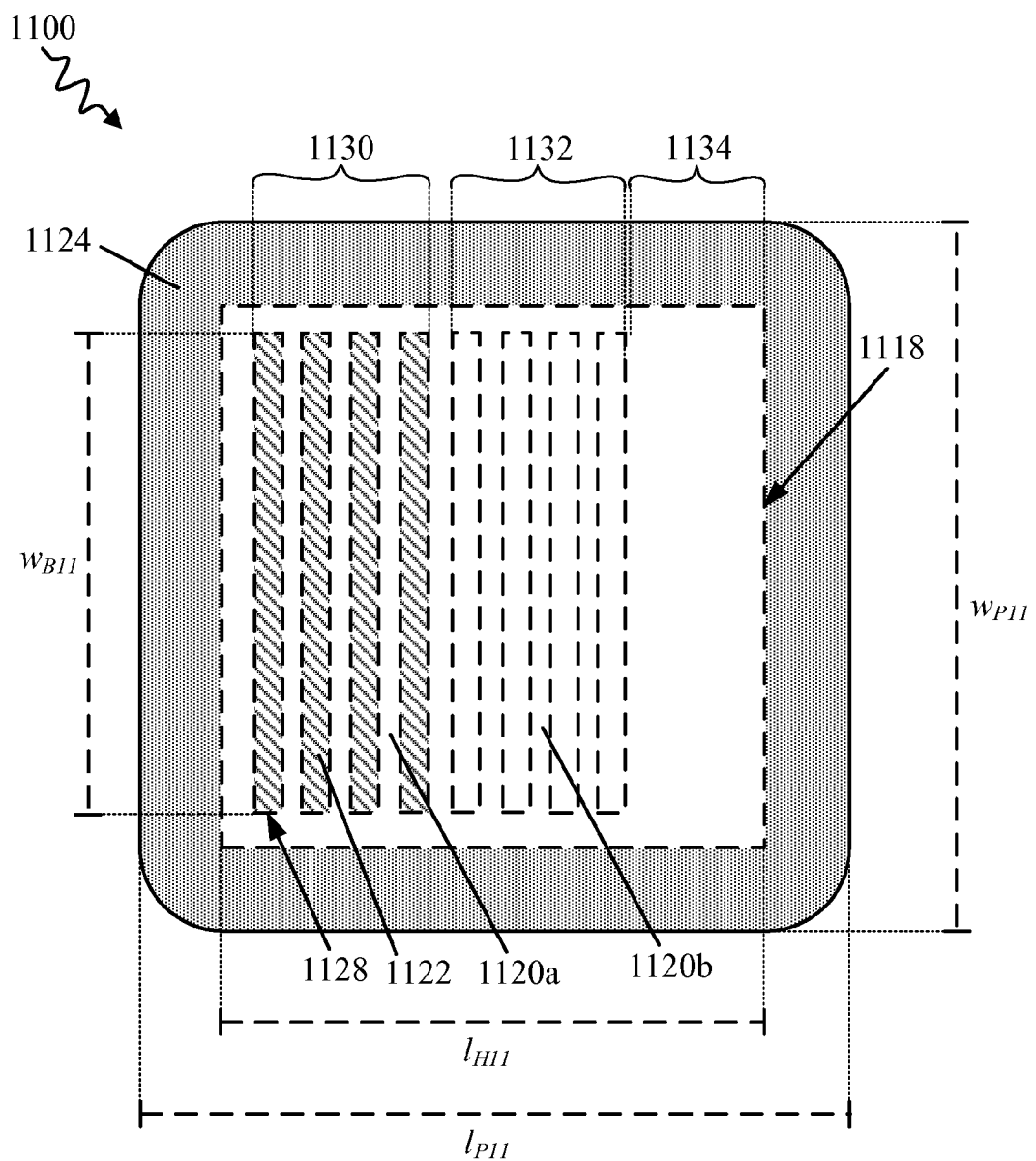
FIG. 12 illustrates a cutaway, top view of the package depicted in FIG. 11.

FIGS. 11 and 12 illustrate schematic views of an IC package 1100 featuring passive thermal management according to another aspect of the disclosure. Specifically, FIG. 11 illustrates a schematic view of a cross-section of the flip-chip IC package 1100, and FIG. 12 illustrates a cutaway, top view of the package 1100. The package 1100 is structurally and functionally similar to the package 300 shown in FIGS. 3 and 4, except for a some differences in the structure of the heat spreader 1118 and the manner in which the PCM 1122 is positioned therein.

Referring to FIG. 11, the heat spreader 1118 includes a first region 1130, a second region 1132, and a third region 1134. The first region 1130 has relatively high heat dissipation capability, and is situated over a portion of the die 1102 that generates a large amount of heat, The first region includes a plurality of fins 1120a having PCM 1122 interposed between the fins 1120a. Thus, the fins 1120a form basins 1128 wherein the PCM 1122 resides. The PCM 1122 and fins 1120a serve to dissipate heat generated. by the die 1102 in the same manner as described above with respect to the package 300 depicted in FIGS. 3 and 4. The second region 1132 has relatively moderate heat dissipation capability, and is situated over a portion of the die 1102 that generates a moderate amount of heat but less than the heat generated by the portion of the die 1102 underneath the first region 1130. The second region 1132 includes a plurality of fins 1120b without PCM interposed between the fins 1120b. The third region 1134 has a relatively low heat dissipation capability compared to the other regions 1130, 1132 because it lacks PCM and fins. The third region 1134 may be situated over a portion of the die 1102 that does not generate much heat and therefore requires less heat to be dissipated. In this fashion, the heat spreader 1118 may be designed to include a plurality of low heat dissipation, moderate heat dissipation, and high heat dissipation regions that are situated over portions of the die 1102 based on the amount of heat those die 1102 portions are expected to generate. In some cases, fabricating a heat spreader 1118 that does not include fins 1120a, 1120b, and/or PCM 1122 at specific regions of the heat spreader 1118 may conserve money, time, and/or other resources. The package 1100 has a thickness $t_{P11}$ (i.e., height) bounded by the peak surface 1126 of the molding compound 1124 and the bottom surface 1106 of the substrate 1108. The heat spreader 1118 has a thickness $t_{H11}$, and the die 1102 has a thickness $t_{D11}$.

In FIG. 12 a portion of the molding compound 1124 has been removed to illustrate the heat spreader 1118, the basins 1128, the first region 1130, the second region 1132, the third region 1134, the fins 1120a, 1120b, and the PCM 1122 of the package 1100. Referring to FIGS. 11 and 12, the PCM 1122 filled chambers 1128 are positioned side-by-side next to each other along the length $l_{H11}$ of the heat spreader 1118 such that the widths $w_{C11}$ of the chambers 1128 are parallel to each other and the width $w_{P11}$ of the package 1100. According to one aspect of the disclosure, the molding compound 1124 may only partially encase the heat spreader 1118 such that a portion of the heat spreader 1118 is exposed to ambient air outside of the package 1100. For example, referring to FIG. 11, the ends of the fins 1120a, 1120b of the heat spreader 1118 may be exposed to air.

Figure 13:
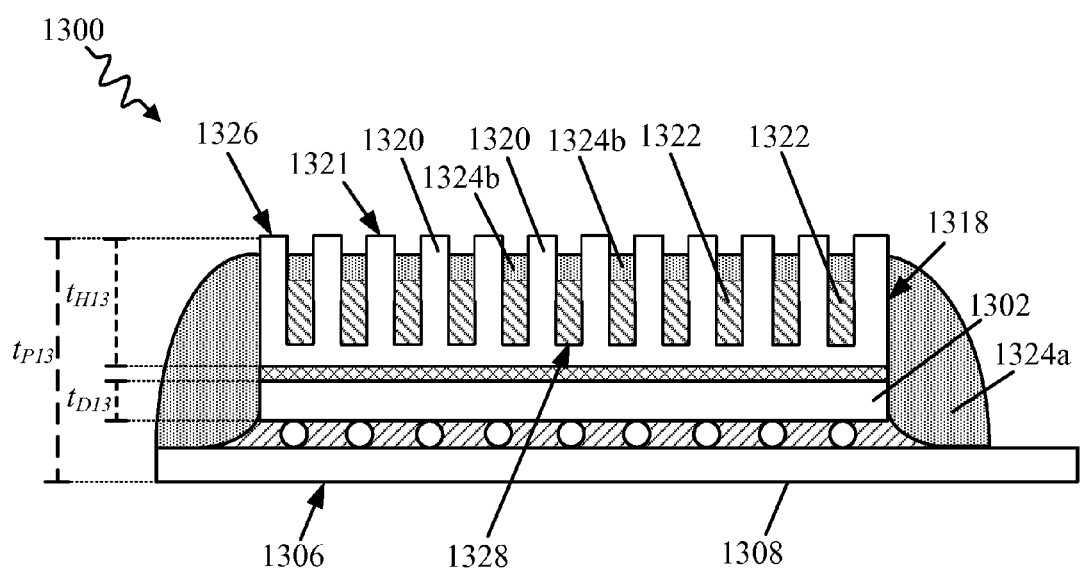
FIG. 13 illustrates a schematic view of a cross-section of a flip-chip IC package featuring passive thermal management.
Figure 14:
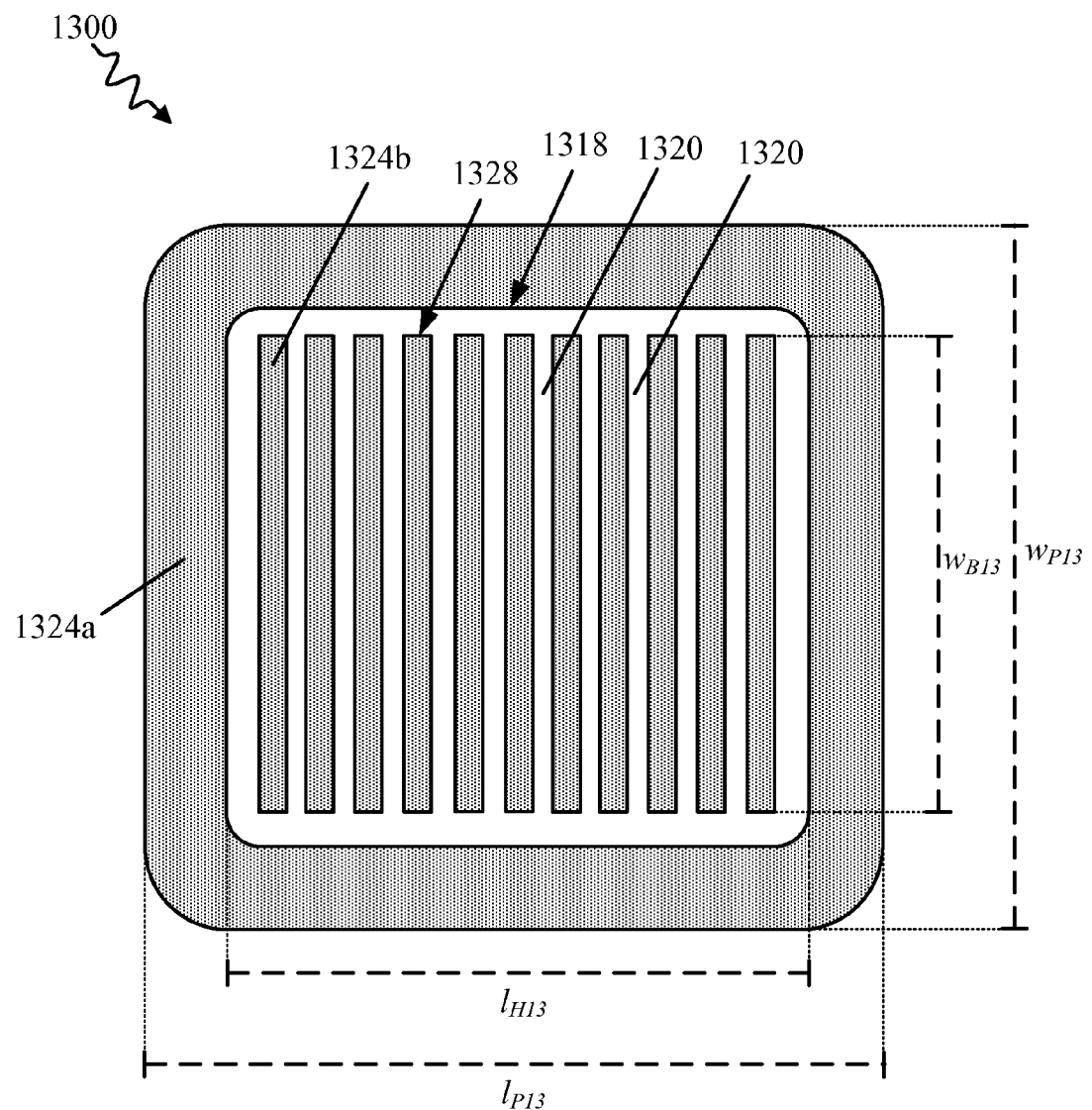
FIG. 14 illustrates a top view of the package depicted in FIG. 13.

FIGS. 13 and 14 illustrate schematic views of an IC package 1300 featuring passive thermal management according to another aspect of the disclosure. Specifically, FIG. 13 illustrates a schematic view of a cross-section of the flip-chip IC package 1300, and FIG. 14 illustrates a top view of the package 1300. The package 1300 is structurally and functionally identical to the package 300 shown in FIGS. 3 and 4, except for a some differences in the structure of the heat spreader 1318 and the manner in which the PCM 1322 is positioned therein.

Referring to FIG. 13, each of the plurality of fins 1320 have a first end 1321 that extends, at least partially, outside the molding compound 1324a and may be exposed to air. As a result, a plurality of molding compound pools 1324b are formed in between the fins 1320 that cover the PCM 1322 below. The plurality of molding compound pools 1324b adhere to the fins 1320 and prevent the PCM 1322 underneath from seeping outside of the package 1300. Thus, the PCM 1322 is encased by the molding compound 1324a and molding compound pools 1324b. A plurality of basins 1328 contain the PCM 1322. In the illustrated example, a plurality of basins 1328 are shown, however, in other aspects of the disclosure there may be as few as one basin formed between two fins of a heat spreader. The package 1300 has a thickness $t_{P13}$ (i.e., height) bounded by the peak surface 1326 of the heat spreader's fins 1320 and the bottom surface 1306 of the substrate 1308. The heat spreader 1318 has a thickness $t_{H13}$, and the die 1302 has a thickness $t_{D13}$.

FIG. 14, depicting a top view of the package 1300, illustrates the molding compound 1324a, the molding compound pools 1324b, the heat spreader 1318, the heat spreader fins 1320, and the basins 1328. The package 1300 has a width $w_{P13}$ and a length $l_{P13}$. The PCM 1322 filled chambers 1328 are positioned side-by-side next to each other along the length $l_{H13}$ of the heat spreader 1318 such that the widths $w_{B13}$ of the basins 1328 are parallel to each other and the width $w_{P13}$ of the package 1300.

Figure 15:
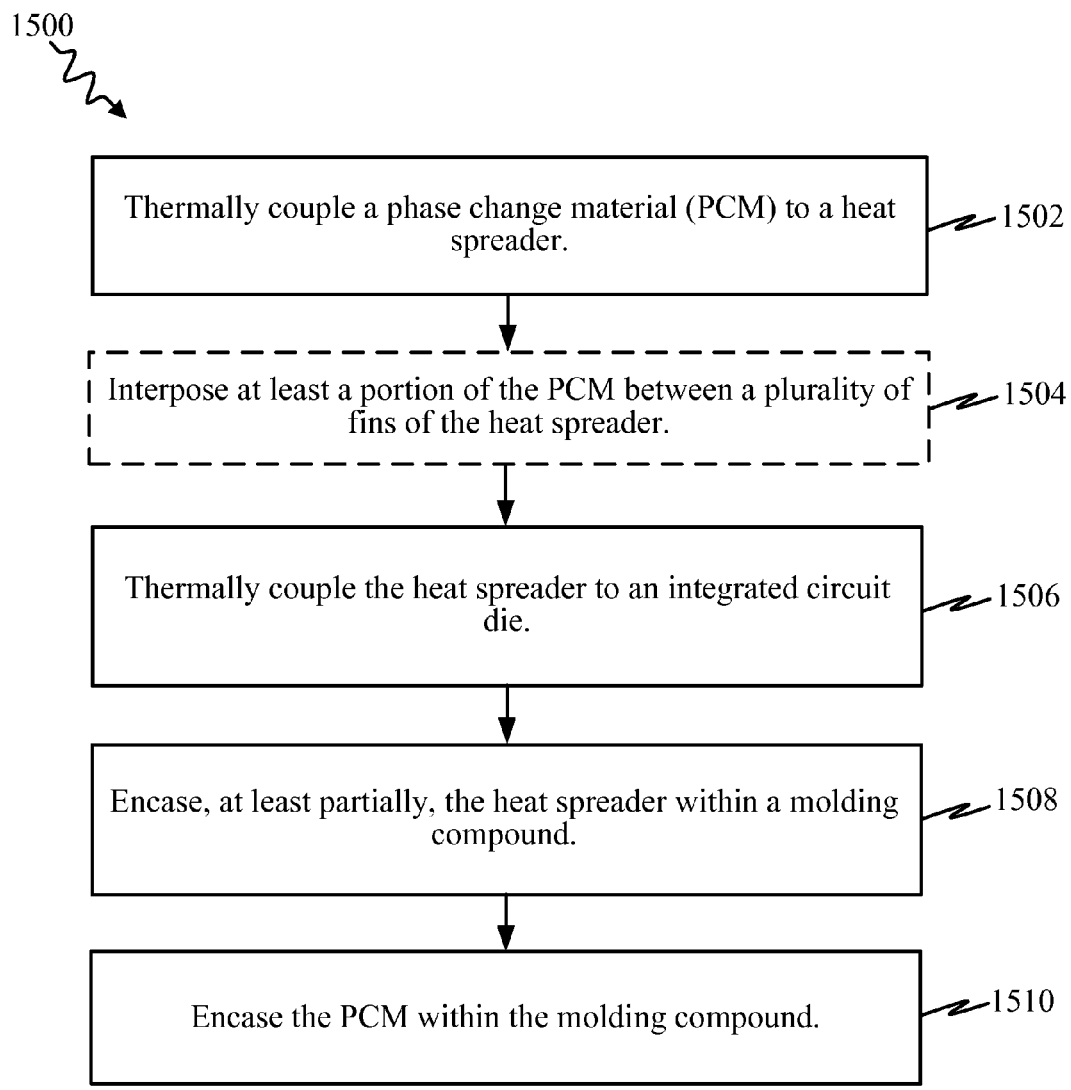
FIG. 15 illustrates a flowchart of a method for fabricating an apparatus having passive thermal management.

FIG. 15 illustrates a flowchart 1500 of a method for fabricating an apparatus having passive thermal management according to one aspect of the disclosure. At step 1502, a phase change material (PCM) may be thermally coupled to a heat spreader. According to one example, the heat spreader may be manufactured such that it fully encapsulates the PCM within the heat spreader. Optionally, at step 1504, the PCM may be thermally coupled to the heat spreader by interposing at least a portion of the PCM between a plurality of fins of the heat spreader. At step 1506, the heat spreader may be thermally coupled to an integrated circuit die. At step 1508, the heat spreader thermally coupled to the PCM may be encased, at least partially, within a molding compound. At step 1510, the PCM may be (e.g., completely) encased within the molding compound. According to at least one aspect of the present disclosure, a heat spreader that does not contain PCM may be thermally coupled to integrated circuit die first before PCM is introduced and thermally coupled to the heat spreader. For example, a heat spreader may be thermally coupled to an IC die. Then, a PCM may be interposed between a plurality of fins of the heat spreader. Finally, the heat spreader containing the PCM may be encased with a molding compound that fully encapsulates the PCM and encapsulates, at least partially, the heat spreader.

Figure 16:
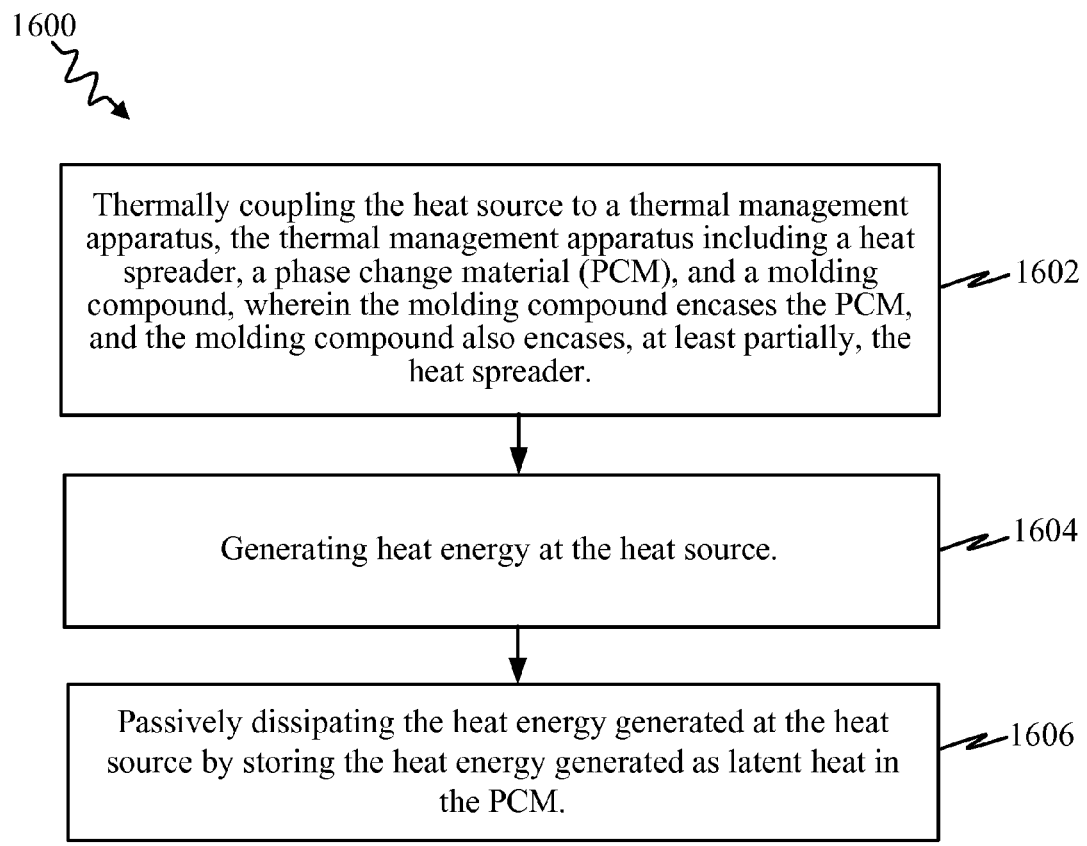
FIG. 16 illustrates a flowchart of a method for passively cooling a heat source, such as an integrated circuit die.

FIG. 16 illustrates a flowchart 1600 of a method for passively cooling a heat source according to one aspect of the disclosure. At step 1602, the method comprises thermally coupling the heat source to a thermal management apparatus, where the thermal management apparatus includes a heat spreader, a phase change material (PCM), and a molding compound. The molding compound encases the PCM, and the molding compound also encases, at least partially, the heat spreader. At step 1604, the method further comprises generating heat energy at the heat source. At step 1606, the method further comprises passively dissipating the heat energy generated at the heat source by storing the heat energy generated as latent heat in the PCM. According to one aspect the heat source may be an integrated circuit die.

The specific type(s) of solid-liquid PCM 322, 522, 722, 922, 1122, 1322 used in the packages 300, 500, 700, 900, 1100, 1300 may be selected based on a number of different properties including, but not limited to, the PMI's melting point, thermal conductivity, and latent heat capacity. According to one example, the PCM 322, 522, 722, 922, 1122, 1322 may comprise a shape-stabilized composite paraffin as the latent heat storage medium and a high density polyethylene compound as a supporting material, including expanded graphite. The shape-stabilizing property of such a PCM 322, 522, 722, 922, 1122, 1322 means that the PCM 322, 522, 722, 922, 1122, 1322 substantially retains its shape even though the material is technically in a liquid state. Such a PCM 322, 522, 722, 922, 1122, 1322 may have a thermal conductivity between 0.5-1.3 Watts per meter Kelvin, a melting point between 30-50° C., and a latent heat capacity between 120-180 Joules per gram. According to another example, the PCM 322, 522, 722, 922, 1122, 1322 may comprise a micro or nano encapsulated composite paraffin as the latent heat storage medium and a high density polyethylene as the supporting material, including expanded graphite. As one example, such a PCM 322, 522, 722, 922, 1122, 1322 may have a melting point between 10-30° C., and a latent heat capacity between 70-130 Joules per gram. In one aspect of the disclosure, the PCM 322, 522, 722, 922, 1122, 1322 may comprise a shape-stabilized composite paraffin improved by addition of expanded graphite. In another aspect of the disclosure, the PCM 322, 522, 722, 922, 1122, 1322 may comprise a micro or nano-encapsulated composite paraffin as latent heat storage medium and high-density polyethylene compound as supporting material without expanded graphite.

As mentioned above, the PCM 322, 522, 722, 922, 1122, 1322 used in the packages 300, 500, 700, 900, 1100, 1300 may be selected based on the melting point of the PCM. In one aspect of the disclosure, it may be desirable to limit the maximum allowed, operating temperature of the die 302, 502, 702, 902, 1102, 1302 to a temperature $t_M$. In that case, a PCM 322, 522, 722, 922, 1122, 1322 may be selected that has a melting point that is less than $t_M$ so that the PCM 322, 522, 722, 922, 1122, 1322 undergoes the phase change transition before the maximum operating temperature $t_M$ is achieved. As just one example, the maximum operating temperature of the die 302, 502, 702, 902, 1102, 1302 that may be tolerated is 95° C. In such a case, a PCM 322, 522, 722, 922, 1122, 1322 may be selected for the packages 300, 500, 700, 900, 1100, 1300 that has a melting point that is less than 95° C., such as 50° C.

According to some aspects of the disclosure, the PCM 322, 522, 722, 922, 1122, 1322 may be other types of solid-liquid PCM, such as organic PCMs (including parafins and non-parafins), inorganic PCMs, and eutectics. Examples of organic PCMs that may be used in packages 300, 500, 700, 900, 1100, 1300 include, but are not limited to, n-tetradeca, formic acid, n-pentadeca, acetic acid, n-hexadeca, caprilone, docasyle, n-henicosan, phenol, n-lauric, p-joluidine, cynamide, n-docosane, n-tricosane, hydrocinna, cetyl, o-nitroanili, camphene, diphenyl, n-penta cosane, myristic acid, oxolate, tristearin, o-xylene, β-chloroacetic, n-hexacosane, nitro naphthalene, α-chloroacetic, n-octacosane, palmitic acid, bees wax, glyolic acid, p-bromophenol, azobenzene, acrylic acid, dintro toluene, phertylacetic acid, and/or thiosinamine. Examples of inorganic PCMs that may be used in packages 300, 500, 700, 900, 1100, 1300, include but are not limited to water, $POCl_3$, $SbCl_5$, $H_2SO_4$, MOF, $P_4O_6$, $H_3PO_4$, Cs, Ga, $AsBr_3$, $BI_3$, $TiBr_4$, $H_4P_2O_6$, $SO_3$, and/or $SbCl_3$.

According to another aspect of the disclosure, the PCMs 322, 522, 722, 922, 1122, 1322 used in the packages 300, 500, 700, 900, 1100, 1300 may be solid-solid PCMs. The PCMs store heat energy by transitioning from one crystalline structure to another. Such transitions have the advantage that in some cases they occur with less volume change in the material, and thus may be an appropriate choice for certain applications. Examples of solid-solid PCMs that may be used in packages 300, 500, 700, 900, 1100, 1300 include, but are not limited to, penterythritol, neopentyl glycol, trihydroxy methyl-aminomethane, diaminopentacrythritol, trumethylolethane, pentaglycerin, monoaminopentaerythritol, tris(hydroxymethyl) acetic acid, and combinations of the aforementioned solid-solid PCMs.

In applications where the packages 300, 500, 700, 900, 1100, 1300 are implemented in small form factor devices, it is imperative that the packages 300, 500, 700, 900, 1100, 1300 accommodate the spatial limitations and size constraints of the device. Besides being generally small in size, the packages 300, 500, 700, 900, 1100, 1300 may be thin to accommodate small form factor devices having a particularly thin profile. As illustrated in FIGS. 3, 5, 7, 9, 11, and 13, the thickness (i.e., height) $t_{P3}, t_{P5}, t_{P7}, t_{P9}, t_{P11}, t_{P13}$ of the packages 300, 500, 700, 900, 1100, 1300 may be defined by the distance between the peak surface 326, 526, 726, 926, 1126 of the molding compound 324, 524, 724, 924, 1124 (for $t_{P13}$ the peak surface 1326 of the heat spreader 1318) and the bottom surface 306, 506, 706, 906, 1106, 1306 of the substrate 308, 508, 708, 908, 1108, 1308. The thickness $t_{P3}$, $t_{P5}$, $t_{P7}$, $t_{P9}$, $t_{P11}$, $t_{P13}$ of the packages 300, 500, 700, 900, 1100, 1300 featuring the (at least partially) embedded heat spreader 318, 518, 718, 918, 1118, 1318 and PCM 322, 522, 722, 922, 1122, 1322 may be significantly less than the thickness $t_{P1}$ of the combination package 100 and heat spreader 114 shown in FIG. 1. Moreover, the thickness $t_{P3}$, $t_{P5}$, $t_{P7}$, $t_{P9}$, $t_{P11}$, $t_{P13}$ of the packages 300, 500, 700, 900, 1100, 1300 may be equal to or less than the thickness $t_{P2}$ of the package 200 shown in FIG. 2. Thus, according to one example the packages 300, 500, 700, 900, 1100, 1300 illustrated in FIGS. 3-14 may have a thickness $t_{P3}$, $t_{P5}$, $t_{P7}$, $t_{P9}$, $t_{P11}$, $t_{P13}$ that is no greater than existing prior art packages that do not feature an embedded heat spreader and/or PCM material.

Figure 2:
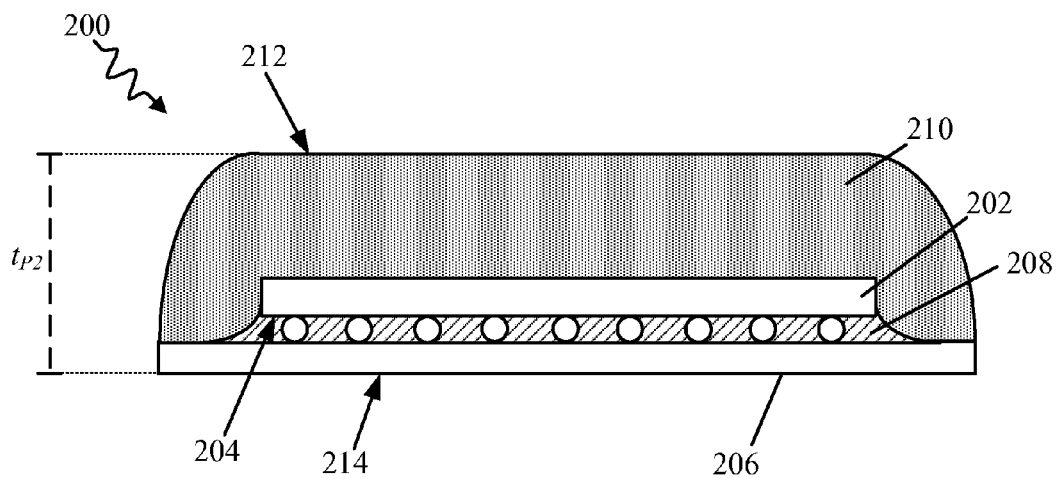
FIG. 2 illustrates a schematic view of a cross-section of a flip-chip IC package found in the prior art that does not include a heat spreader.

According to one aspect of the disclosure, the thickness $t_{P3}$, $t_{P5}$, $t_{P7}$, $t_{P9}$, $t_{P11}$, $t_{P13}$ of the packages 300, 500, 700, 900, 1100, 1300 may be slightly greater than the thickness $t_{P2}$ of the package 200 shown in FIG. 2. For example, the thickness $t_{P3}$, $t_{P5}$, $t_{P7}$, $t_{P9}$, $t_{P11}$, $t_{P13}$ may be between one and four times greater than the thickness $t_{P2}$. It may be appreciated that in the case where the thicknesses $t_{P2}$ and $t_{P3}$, $t_{P5}$, $t_{P7}$, $t_{P9}$, $t_{P11}$, $t_{P13}$ are approximately the same (assuming also other package dimensions, such as width and length are substantially equal), the packages 300, 500, 700, 900, 1100, 1300 may contain less molding compound 324, 524, 724, 924, 1124, 1324a/1324b than the package 200 because a portion of the packages' 300, 500, 700, 900, 1100, 1300 volume is occupied by the heat spreaders 318, 518, 718, 918, 1118, 1318 and PCMs 322, 522, 722, 922, 1122, 1122.

FIGS. 3, 5, 7, 9, 11, and 13 also illustrate the thickness $t_{D3}$, $t_{D5}$, $t_{D7}$, $t_{D9}$, $t_{D11}$, $t_{D13}$ of the die 302, 502, 702, 902, 1102, 1302 and the thickness $t_{H3}$, $t_{H5}$, $t_{H7}$, $t_{H9}$, $t_{H11}$, $H_{H13}$ of the heat spreader 318, 518, 718, 918, 1118, 1318 within the packages 300, 500, 700, 900, 1100, 1300. In at least one aspect of the disclosure, the thickness $t_{H3}$, $t_{H5}$, $t_{H7}$, $t_{H9}$, $t_{H11}$, $t_{H13}$ of the heat spreader 318, 518, 718, 918, 1118, 1318 is between 0.2 times and 1.0 times the thickness $t_{D3}$, $t_{D5}$, $t_{D7}$, $t_{D9}$, $t_{D11}$, $t_{D13}$ of the die 302, 502, 702, 902, 1102, 1302. In another aspect of the disclosure, the thickness $t_{H3}$, $t_{H5}$, $t_{H7}$, $t_{H9}$, $t_{H11}$, $t_{H13}$ is between 1.0 times and 4 times the thickness $t_{D3}$, $t_{D5}$, $t_{D7}$, $t_{D9}$, $t_{D11}$, $t_{D13}$. In another aspect of the disclosure, the thickness $t_{H3}$, $t_{H5}$, $t_{H7}$, $t_{H9}$, $t_{H11}$, $t_{H13}$ is between 4 times and 100 times the thickness $t_{D3}$, $t_{D5}$, $t_{D7}$, $t_{D9}$, $t_{D11}$, $t_{D13}$. As one example, the thickness $t_{H3}$, $t_{H5}$, $t_{H7}$, $t_{H9}$, $t_{H11}$, $t_{H13}$ may be between 1 and 10 microns. As another example, the thickness $t_{H3}$, $t_{H5}$, $t_{H7}$, $t_{H9}$, $t_{11}$, $t_{H13}$ may be between 10 and 1,000 microns. As yet another example, the thickness $t_{H3}$, $t_{H5}$, $t_{H7}$, $t_{H9}$, $t_{H11}$, $t_{H13}$ may be between 1,000 and 10,000 microns. In at least one aspect of the disclosure, the thickness $t_{H3}$, $t_{H5}$, $t_{H7}$, $t_{H9}$, $t_{H11}$, $t_{H13}$ of the heat spreader is between 10% and 25% of the thickness $t_{P3}$, $t_{P5}$, $t_{P7}$, $t_{P9}$, $t_{P11}$, $t_{P13}$ of the packages 300, 500, 700, 900, 1100, 1300. In another aspect of the disclosure, the thickness $t_{H3}$, $t_{H5}$, $t_{H7}$, $t_{H9}$, $t_{11}$, $t_{H13}$ is between 25% and 50% of the thickness $t_{P3}$, $t_{P5}$, $t_{P7}$, $t_{P9}$, $t_{P11}$, $t_{P13}$. In another aspect of the disclosure, the thickness $t_{H3}$, $t_{H5}$, $t_{H7}$, $t_{H9}$, $t_{H11}$, $t_{H13}$ is between 50% and 75% of the thickness $t_{P3}$, $t_{P5}$, $t_{P9}$, $t_{P11}$, $t_{P13}$. In another aspect of the disclosure, the thickness $t_{H3}$, $t_{H5}$, $t_{H7}$, $t_{H9}$, $t_{H11}$, $t_{H13}$ is between 75% and 99% of the thickness $t_{P3}$, $t_{P5}$, $t_{P7}$, $t_{P9}$, $t_{P11}$, $t_{P13}$.

In at least one aspect of the disclosure, the heat spreaders 318, 518, 718, 918, 1118, 1318 of the packages 300, 500, 700, 900, 1100, 1300 provide support, stability, and security to the underlying die 302, 502, 702, 902, 1102, 1302 and to the package 300, 500, 700, 900, 1100, 1300 as a whole. For example, the heat spreaders 318, 518, 718, 918, 1118, 1318 and any associated fins embedded within the molding compounds 324, 524, 724, 924, 1124, 1324a/1324b may be made of a metal (e.g., copper), that provides structural support to the packages 300, 500, 700, 900, 1100, 1300. Moreover, the heat spreaders 318, 518, 718, 918, 1118, 1318 may also help alleviate die and package warpage. For example, the heat spreaders 318, 518, 718, 918, 1118, 1318 may be composed of a material that has a thermal coefficient of expansion that is similar/close to the thermal coefficient of expansion of the substrates 308, 508, 708, 908, 1108, 1308. The material used may also have a high stiffness which strongly resists bending, such as metal (e.g., copper). These properties allow the heat spreaders 318, 518, 718, 918, 1118, 1318 to balance the thermal expansion of the substrates 308, 508, 708, 908, 1108, 1308 and resist large amounts of die 302, 502, 702, 902, 1102, 1302 bending, thereby alleviating die and package warpage.

According to one aspect of the disclosure, the heat spreaders 318, 518, 718, 918, 1118, 1318 serve as some examples of a means for passively dissipating heat energy thermally coupled to the integrated circuit dies 302, 502, 702, 902, 1102, 1302. The PCMs 322, 522, 722, 922, 1122, 1322 serve as some examples of a means for storing latent heat thermally coupled to heat spreaders 318, 518, 718, 918, 1118, 1318. The molding compounds 324, 524, 724, 924, 1124, 1324 serve as some examples of a means for encasing at least partially the heat spreaders 318, 518, 718, 918, 1118, 1318, The plurality of fins 320, 1120a, 1120b, 1320 and chamber barriers/walls 520, 932 serve as some examples of a means for increasing the surface area of the heat spreaders 318, 518, 718, 918, 1118, 1318. The basins 328, 1128, 1328 and the chambers 528, 728, 928 serve as some examples of a means for containing the PCMs 322, 577, 777, 922, 1122, 1322.

Exemplary Implementation of IC Having Molding Compound Containing PCM

Figure 17:
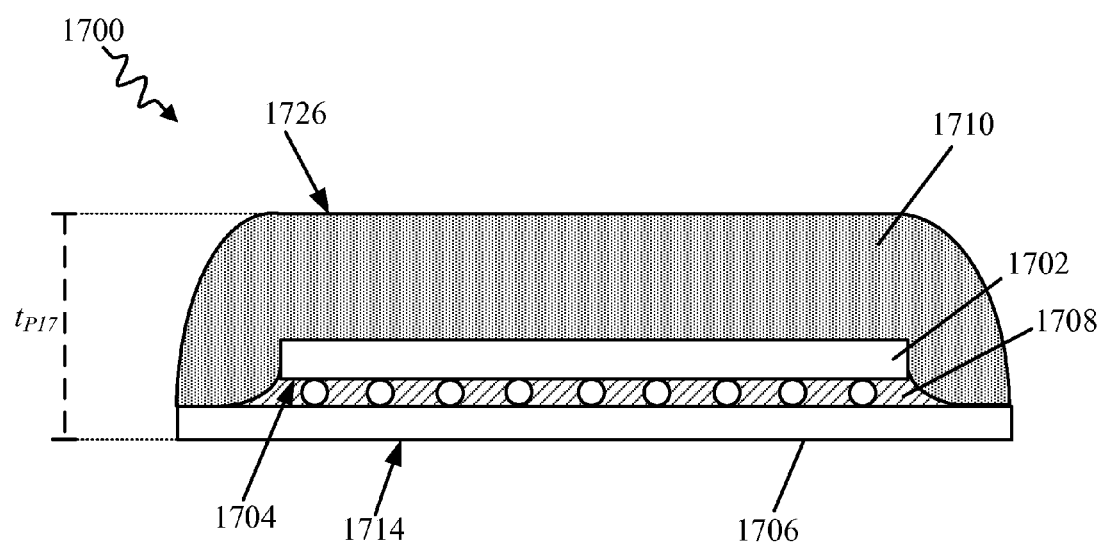
FIG. 17 illustrates a schematic view of a cross-section of a flip-chip IC package featuring a molding compound having phase change material intermixed therein.

FIG. 17 illustrates a schematic view of a cross-section of a flip-chip IC package 1700 according to another aspect of the disclosure. The package 1700 includes an IC die 1702 having a front surface 1704 (i.e., active surface) that is coupled to a package substrate 1706 (e.g., laminate substrate, metal based substrate, such as copper based substrate, etc.) via a die attach and/or underfill adhesive 1708. An epoxy and/or resin molding compound containing PCM 1710 encases the die 1702 and the die attach and/or underfill adhesive 1708. The molding compound containing PCM 1710 may also encase a backside metallization layer and/or heat spreader that may be coupled to the die 1702. Thus, unlike the packages 100, 200 depicted in FIGS. 1 and 2, the compound. 1710 of the package 1700 shown in FIG. 17 includes traditional molding compound with PCM intermixed therein (the combination may be referred to herein as an "enhanced molding compound"). Such a combination of traditional epoxy and/or resin molding compound and PCM results in a compound 1710 that offers a sufficient amount of physical support to stabilize and protect the die, yet also has a higher thermal conductivity than traditional molding compounds alone. The higher thermal conductivity helps dissipate heat generated by the die 1702 better than traditional molding compounds. The package 1700 has a thickness $t_{P17}$ (i.e., height) defined by the distance between the peak surface 1712 of the PCM molding compound 1710 and the bottom surface 1714 of the substrate 1706. The thickness $t_{P17}$ may less than or equal to the thickness $t_{P2}$ of the package 200 (See FIG. 2).

In at least one aspect of the disclosure, the molding compound containing PCM 1710 may be used in combination with any of the various packages 300, 500, 700, 900, 1100, 1300 described herein. That is, in some cases the molding compounds 324, 524, 724, 924, 1124, 1324 may be intermixed with a PCM (herein referred to also as "molding compound phase change material") to gain the benefits described above with respect to the compound 1710. The specific type of PCM intermixed within the molding compound may be any of the PCMs described above with respect to PCMs 322, 522, 722, 922, 1122, 1322. According to one aspect of the disclosure, the enhanced molding compound 1710 serves as one example of a means for encasing the die 1702 that comprises a phase change material intermixed therein.

Figure 18:
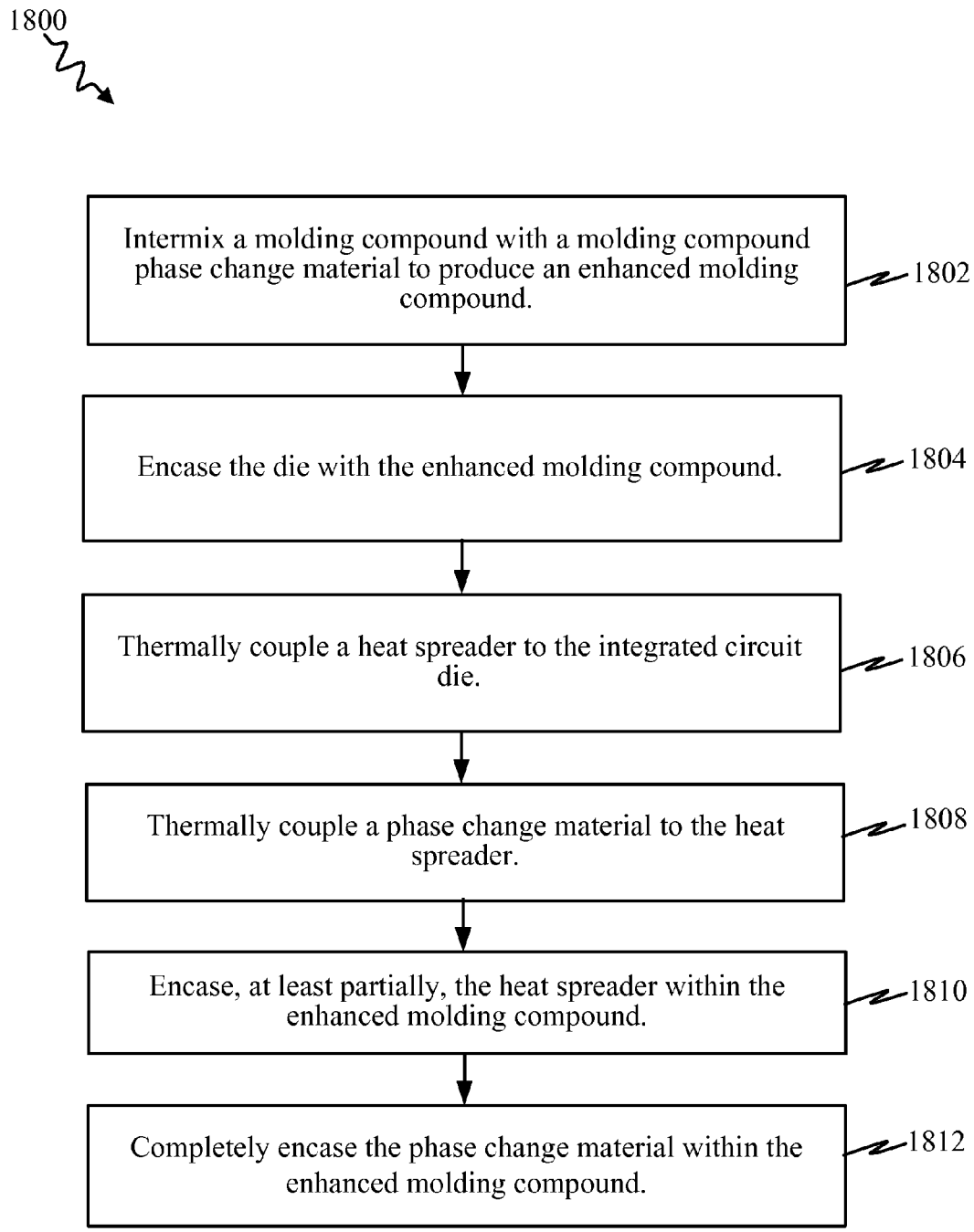
FIG. 18 illustrates a flowchart of a method for fabricating an apparatus having passive thermal management.

FIG. 18 illustrates a flowchart 1800 of a method for fabricating an apparatus having passive thermal management according to one aspect of the disclosure. At step 1802, a molding compound may be intermixed with a molding compound phase change material to produce an enhanced molding compound. At step 1804, an integrated circuit die may be encased with the enhanced molding compound. At step 1806, a heat spreader may be thermally coupled to the integrated circuit die, At step 1808, a phase change material may be thermally coupled to the heat spreader. At step 1810, the heat spreader may be encased, at least partially, within the enhanced molding compound. At step 1812, the phase change material may be completely encased within the enhanced molding compound.

Figure 19:
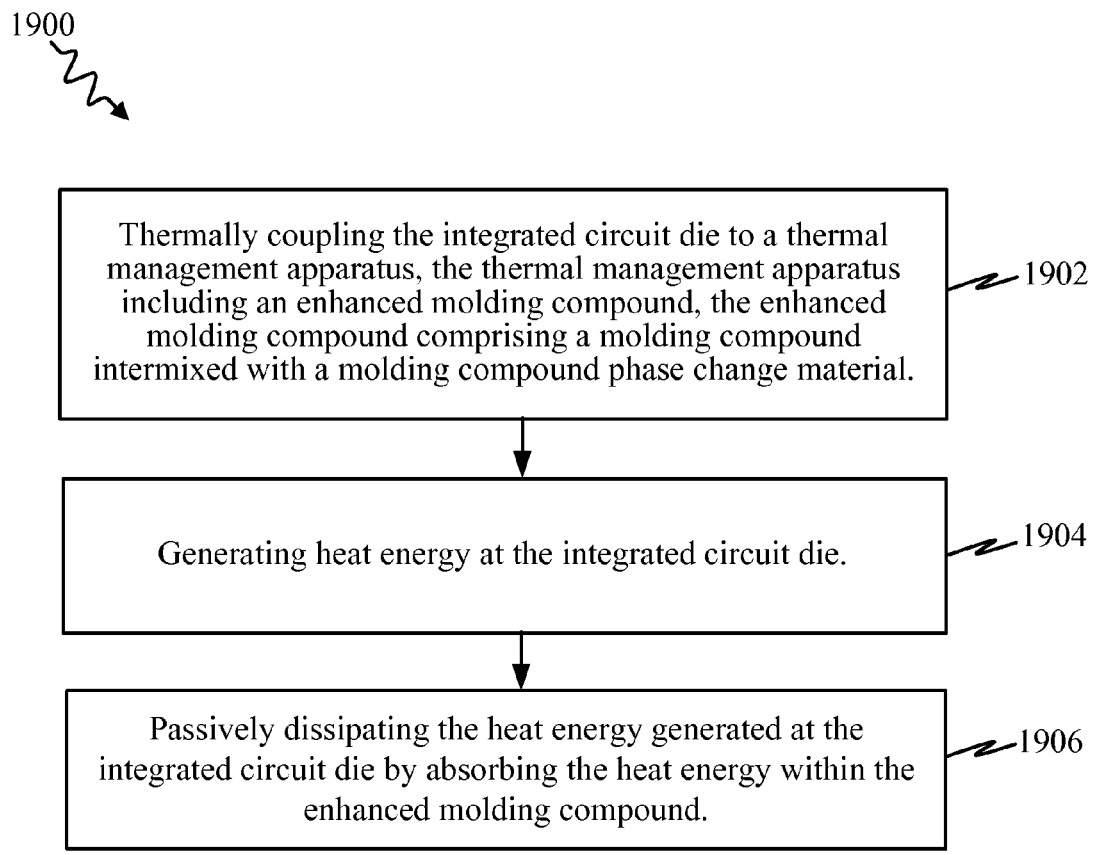
FIG. 19 illustrates a flowchart of a method for passively cooling an integrated circuit die.

FIG. 19 illustrates a flowchart 1900 of a method for passively cooling an integrated circuit die according to one aspect of the disclosure. At step 1902, the method. comprises thermally coupling the integrated circuit die to a thermal management apparatus, where the thermal management apparatus includes an enhanced molding compound, The enhanced molding compound comprises a molding compound intermixed with a molding compound phase change material. At step 1904, the method further comprises generating heat energy at the integrated circuit die. At step 1906, the method further comprises passively dissipating the heat energy generated at the integrated circuit die by absorbing the heat energy within the enhanced molding compound.

Figure 20:
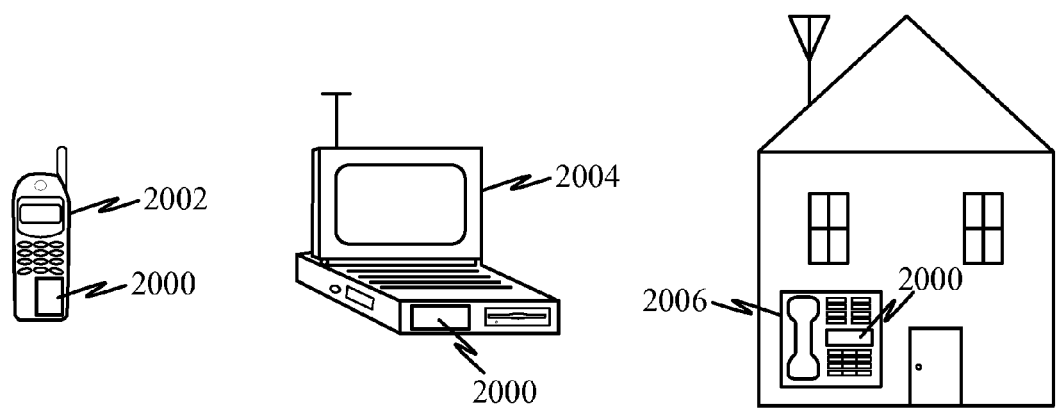
FIG. 20 illustrates various electronic devices that may be integrated with IC packages having passive thermal management.

FIG. 20 illustrates various electronic devices that may be integrated with any of the aforementioned IC packages 300, 500, 700, 900, 1100, 1300, 1700, For example, a mobile telephone 2002, a laptop computer 2004, and a fixed location terminal 2006 may include an IC package 2000 featuring passive thermal management. The IC package 2000 may be, for example, any of the packages 300, 500, 700, 900, 1100, 1300, 1700 described herein. The devices 2002, 2004, 2006 illustrated in FIG. 20 are merely exemplary. Other electronic devices may also feature the IC package 2000 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

The above-described aspects are merely examples of possible implementations that feature flip-chip chip on board (COB) integrated circuits. Many variations and modifications may be made to the above-described embodiments without departing from the principles of the present disclosure. For example, the above-described aspects that feature heat spreaders and PCM can be equally applicable to other types of packaging including but not limited to wire-bond chip on board packaging, dual package (DIP) packaging, pin grid array (PGA) packaging, leadless chip carrier (LCC) packaging, small-outline integrated circuit (SOIC) packaging, plastic leaded chip carrier (PLCC) packaging, plastic quad flat pack (PQFP) packaging and thin quad flat pack (TQFP) packaging, thin small-outline packages (TSOP) packaging, land grid array (LGA) packaging and quad-flat no-lead (QFN) packaging. All such modifications and variations are intended to be included herein within the scope of this disclosure.

One or more of the components, steps, features, and/or functions illustrated in FIGS. 3, 4, 5, 6, 7, 8, 9, 10, 11, 12, 13, 14, 15, 16, 17, 18, 19, and/or 20 may be rearranged and/or combined into a single component, step, feature or function or embodied in several components, steps, or functions. Additional elements, components, steps, and/or functions may also be added without departing from the invention. The packages, apparatuses, devices, and/or components illustrated in FIGS. 3-14 may be formed by one or more of the methods, features, or steps described in FIGS. 15 and/or 16. The package, apparatuses, devices, and/or components illustrated in FIG. 17 may be formed by one or more of the methods, features, or steps described in FIGS. 18 and/or 19.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, etc.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus having passive thermal management, the apparatus comprising:
    an integrated circuit die;
    a heat spreader thermally coupled to the integrated circuit die;
    a phase change material (PCM) thermally coupled to the heat spreader; and
    a molding compound encasing, at least partially, the heat spreader, wherein the molding compound encases the PCM, and wherein the PCM is configured to transition from solid to liquid within an operating temperature of the integrated circuit die.

2. The apparatus of claim 1, wherein the heat spreader comprises a plurality of fins, and at least a portion of the PCM is interposed between the plurality of fins.

3. The apparatus of claim 1, wherein the heat spreader comprises a plurality of fins that form at least one basin, and at least a portion of the PCM resides in the basin.

4. The apparatus of claim 3, wherein the molding compound encasing the PCM physically touches the PCM.

5. The apparatus of claim 1, wherein the heat spreader comprises a plurality of fins that form a plurality of basins containing the PCM, the plurality of basins positioned side-by-side next to each other along a length of the heat spreader.

6. The apparatus of claim 1, wherein the heat spreader comprises a plurality of chambers that contain the PCM, the heat spreader encasing the PCM.

7. The apparatus of claim 6, wherein the plurality of chambers are positioned side-by-side next to each other along a length of the heat spreader.

8. The apparatus of claim 6, wherein the plurality of chambers are positioned side-by-side next to each other along a thickness of the heat spreader.

9. The apparatus of claim 1, wherein the heat spreader comprises a first region positioned over a high heat region of the die and a second region positioned over a low heat region of the die, the first region including a plurality of fins having the PCM interposed therein, the second region lacking the PCM, wherein the high heat region of the die generates heat energy at a greater rate than the low heat region of the die when the apparatus is powered ON.

10. The apparatus of claim 1, wherein the PCM is adapted to passively dissipate heat energy generated by the die by changing phase from a solid to a liquid at its melting point.

11. The apparatus of claim 10, wherein the melting point, of the PCM is less than a maximum allowed operational temperature $t_M$ of the die.

12. The apparatus of claim 1, wherein a thickness of the heat spreader is between one (1) times and ten (10) times a thickness of the die.

13. The apparatus of claim 1, wherein the heat spreader is adapted to reduce die warpage.

14. The apparatus of claim 1, further comprising:
a backside metallization layer having a first side that is thermally coupled to the die and a second side that is thermally coupled to the heat spreader.

15. The apparatus of claim 1, wherein the PCM is one of a shape-stabilized composite paraffin having expanded graphite, a micro-encapsulated composite paraffin and high density polyethylene compound having expanded graphite, a nano-encapsulated composite paraffin and high density polyethylene compound having expanded graphite, a micro-encapsulated composite paraffin and high density polyethylene compound, or a nano-encapsulated composite paraffin and high density polyethylene compound.

16. The apparatus of claim 1, wherein the molding compound comprises a molding compound phase change material.

17. The apparatus of claim 1, wherein the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

18. An apparatus, comprising:
an integrated circuit die;
means for passively dissipating heat energy thermally coupled to the integrated circuit die;
means for storing latent heat thermally coupled to the means for passively dissipating heat energy; and
means for encasing, at least partially, the means for passively dissipating heat energy, wherein the means for encasing, at least partially, the means for passively dissipating heat energy encases the means for storing latent heat, and wherein the means for storing latent heat is configured to transition from solid to liquid within an operating temperature of the integrated circuit die.

19. The apparatus of claim 18, further comprising:
means for increasing a surface area of the means for passively dissipating heat energy, wherein at least a portion of the means for storing latent heat is interposed between the means for increasing the surface area of the means for passively dissipating heat energy.

20. The apparatus of claim 18, wherein the means for passively dissipating heat enemy comprises means for containing the means for storing latent heat, the means for passively dissipating heat energy encasing the means for storing latent heat.

21. The apparatus of claim 20, wherein the means for containing the means for storing latent heat is positioned side-by-side next to a second means for containing the means for storing latent heat along a length of the means for passively dissipating heat energy.

22. The apparatus of claim 20, wherein the means for containing the means for storing latent heat is positioned side-by-side next to a second means for containing the means for storing latent heat along a thickness of the means for passively dissipating heat energy.

23. The apparatus of claim 18, wherein the means for storing latent heat dissipates heat energy generated by the die by changing phase from a solid to a liquid at its melting point, and the melting point of the means for storing latent heat is less than a maximum allowed operational temperature $t_M$ of the die.

24. The apparatus of claim 18, wherein a thickness of the means for passively dissipating heat energy is between one (1) times and ten (10) times a thickness of the die.

25. The apparatus of claim 18, wherein the means for encasing, at least partially, the means for passively dissipating heat energy comprises a phase change material.

26. The apparatus of claim 18, wherein the means for storing latent heat is a phase change material.

27. The apparatus of claim 18, wherein the means for passively dissipating heat energy is a heat spreader.

28. The apparatus of claim 18, wherein the means for encasing is a molding compound.

29. An apparatus, comprising:
an integrated circuit die;
a molding compound having a molding compound phase change material intermixed therein, the molding compound encasing the integrated circuit die;
a heat spreader thermally coupled to the integrated circuit die; and
a phase change material thermally coupled to the heat spreader, wherein the molding compound encases, at least partially, the heat spreader, and completely encases the phase change material.

30. The apparatus of claim 29, wherein the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

31. An apparatus, comprising:
an integrated circuit die;
means for encasing the integrated circuit die, wherein the means for encasing the integrated circuit die comprises a phase change material intermixed therein;
means for passively dissipating heat energy thermally coupled to the integrated circuit die; and
means for storing latent heat thermally coupled to the means for passively dissipating heat energy, wherein the means for encasing encases, at least partially, the means for passively dissipating heat energy, and completely encases the means for storing latent heat.

* * * * *